United States Patent
Myers et al.

[19]

[11] Patent Number: 6,128,323
[45] Date of Patent: Oct. 3, 2000

[54] RELIABLE MODULAR PRODUCTION QUALITY NARROW-BAND HIGH REP RATE EXCIMER LASER

[75] Inventors: David W. Myers, Poway; Herve A. Besaucele, La Jolla; Palash P. Das, Vista; Thomas P. Duffey, San Diego; Alexander I. Ershov, San Diego; Igor V. Fomenkov, San Diego; Thomas Hofmann, San Diego; Richard G. Morton, San Diego; Richard M. Ness, San Diego; Peter C. Newman, Encinitas; Robert G. Ozarski, Poway; Gamaralalage G. Padmabandu, San Diego; William N. Partlo, Poway; Daniel A. Rothweil, San Diego; Richard L. Sandstrom, Encinitas; Paul S. Thompson, Santee; Richard C. Ujazdowski, San Diego; Tom A. Watson, Carlsbad; R. Kyle Webb, Escondido; Paolo Zambon, San Diego, all of Calif.

[73] Assignee: Cymer, Inc., San Diego, Calif.

[21] Appl. No.: 09/157,067

[22] Filed: Sep. 18, 1998

Related U.S. Application Data

[63] Continuation-in-part of application No. 09/118,773, Jul. 18, 1998, Pat. No. 5,936,988, and a continuation-in-part of application No. 09/109,596, Jul. 2, 1998, Pat. No. 6,028,880, and a continuation-in-part of application No. 09/041,474, Mar. 11, 1998, Pat. No. 5,991,324, and a continuation-in-part of application No. 09/034,870, Mar. 4, 1998, Pat. No. 6,005,879, and a continuation-in-part of application No. 09/995,832, Dec. 22, 1997, Pat. No. 5,982,795, and a continuation-in-part of application No. 08/893,904, Jul. 11, 1997, Pat. No. 5,848,089, and a continuation-in-part of application No. 08/842,305, Apr. 23, 1997, Pat. No. 5,835,520.

[51] Int. Cl.[7] .................................................. H01S 3/00
[52] U.S. Cl. ........................ 372/38; 372/37; 372/55; 372/57
[58] Field of Search ................ 372/25, 37, 38, 372/55, 57, 58

[56] References Cited

U.S. PATENT DOCUMENTS

| | | | |
|---|---|---|---|
| 4,258,334 | 3/1981 | McCusker et al. | 372/57 |
| 4,606,034 | 8/1986 | Eden et al. | 372/57 |
| 4,611,327 | 9/1986 | Clark et al. | 372/58 |
| 4,740,982 | 4/1988 | Hakuta et al. | 372/59 |
| 4,959,840 | 9/1990 | Akins et al. | 372/57 |
| 4,964,137 | 10/1990 | Aramaki et al. | 372/59 |
| 5,025,445 | 6/1991 | Anderson | 372/20 |
| 5,048,041 | 9/1991 | Akins et al. | 372/57 |
| 5,313,481 | 5/1994 | Cook et al. | 372/37 |

(List continued on next page.)

*Primary Examiner*—Brian Healy
*Attorney, Agent, or Firm*—John R. Ross, Esq.

[57] ABSTRACT

The present invention provides a reliable modular production quality excimer laser capable of producing 10 mJ laser pulses at 2000 Hz with a full width half, maximum bandwidth of about 0.6 pm or less. Replaceable modules include a laser chamber; a pulse power system comprised of three modules; an optical resonator comprised of a line narrowing module and an output coupler module; a wavemeter module, an electrical control module, a cooling water module and a gas control module. Improvements in the laser chamber permitting the higher pulse rates and improved bandwidth performance include a single upstream preionizer tube and a high efficiency chamber. The chamber is designed for operation at lower fluorine concentration. Important improvements have been provided in the pulse power unit to produce faster rise time and improved pulse energy control. These improvements include an increased capacity high voltage power supply with a voltage bleed-down circuit for precise voltage trimming, an improved commutation module that generates a high voltage pulse from the capacitors charged by the high voltage power supply and amplifies the pulse voltage 23 times with a very fast voltage transformer having a secondary winding consisting of a single four-segment stainless steel rod. A novel design for the compression head saturable inductor greatly reduces the quantity of transformer oil required and virtually eliminates the possibility of oil leakage which in the past has posed a hazard.

56 Claims, 26 Drawing Sheets

U.S. PATENT DOCUMENTS

| | | | |
|---|---|---|---|
| 5,315,611 | 5/1994 | Ball et al. | 372/56 |
| 5,337,330 | 8/1994 | Larson | 372/86 |
| 5,448,580 | 9/1995 | Birx et al. | 372/38 |
| 5,463,650 | 10/1995 | Ito et al. | 372/57 |
| 5,642,374 | 6/1997 | Wakabayashi et al. | 372/57 |
| 5,719,896 | 2/1998 | Watson | 372/86 |
| 5,835,520 | 11/1998 | Das et al. | 372/57 |
| 5,848,089 | 12/1998 | Sarkar et al. | 372/58 |
| 5,936,988 | 9/1999 | Partio et al. | 372/38 |
| 5,982,795 | 11/1999 | Rothweil et al. | 372/38 |
| 5,991,324 | 11/1999 | Knowles et al. | 372/57 |
| 6,005,879 | 12/1999 | Sandstrom et al. | 372/25 |
| 6,014,398 | 1/2000 | Hofmann et al. | 372/60 |
| 6,021,150 | 2/2000 | Partio et al. | 372/57 |
| 6,028,879 | 2/2000 | Ershov | 372/57 |
| 6,028,880 | 2/2000 | Carlesi et al. | 372/58 |
| 6,055,259 | 4/2000 | Frey et al. | 372/57 |

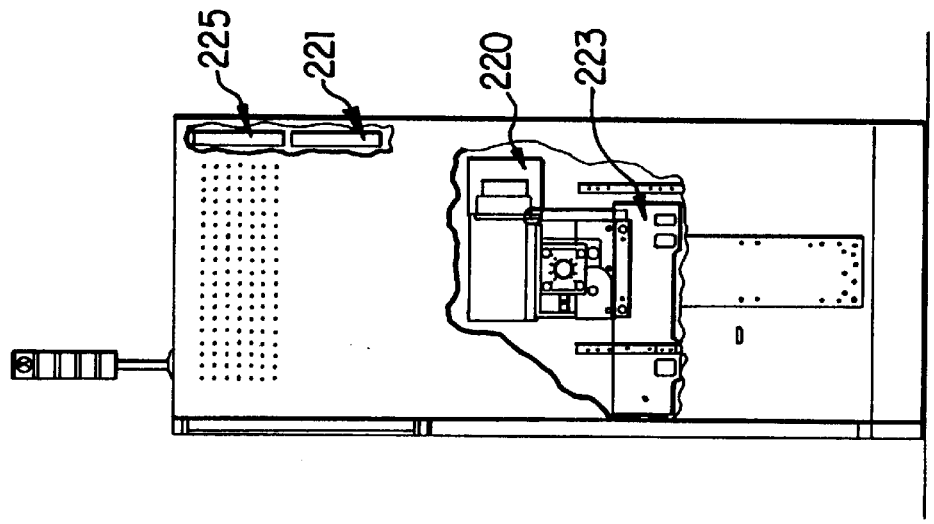
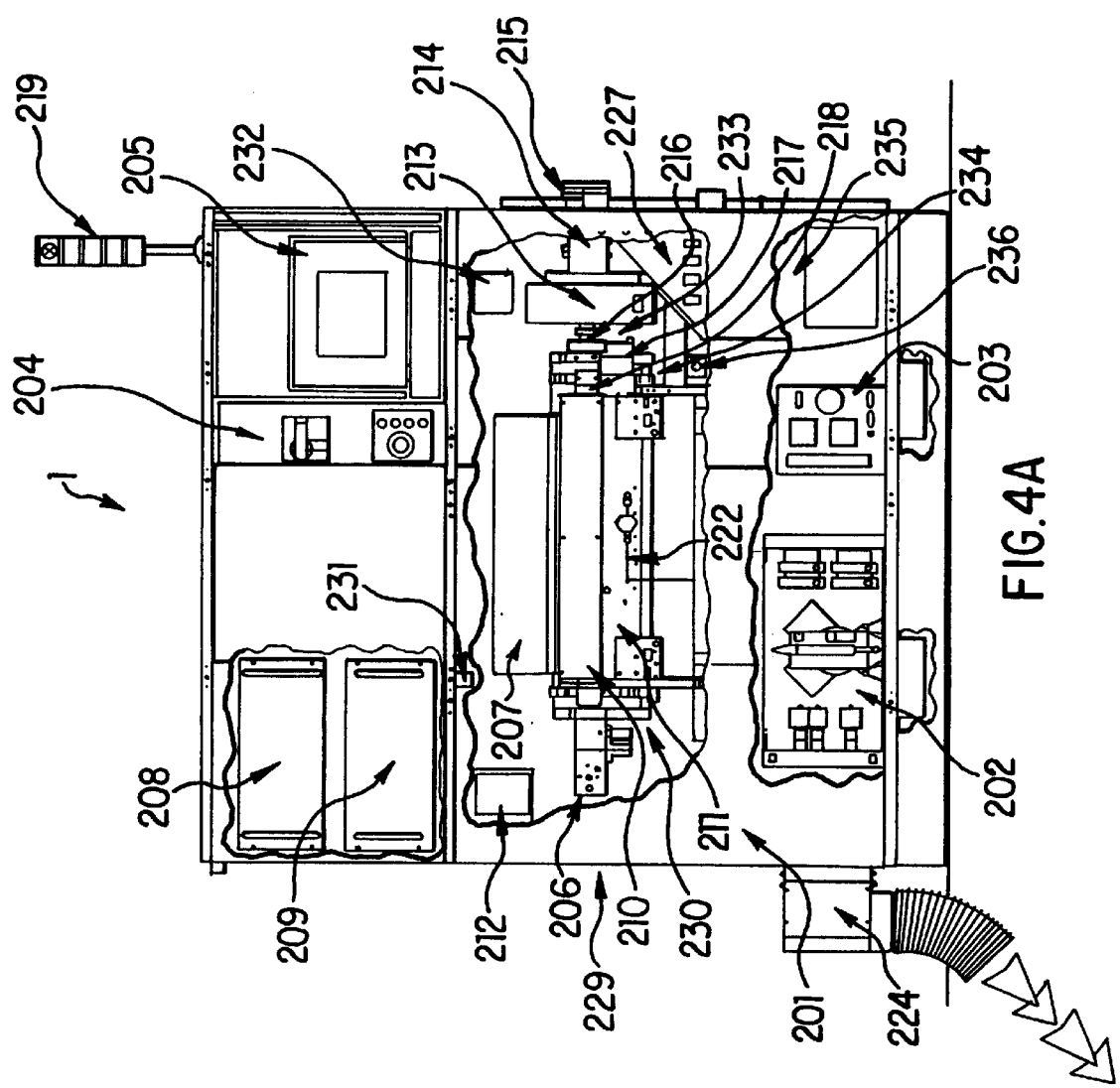
FIG.4B
FIG.4A

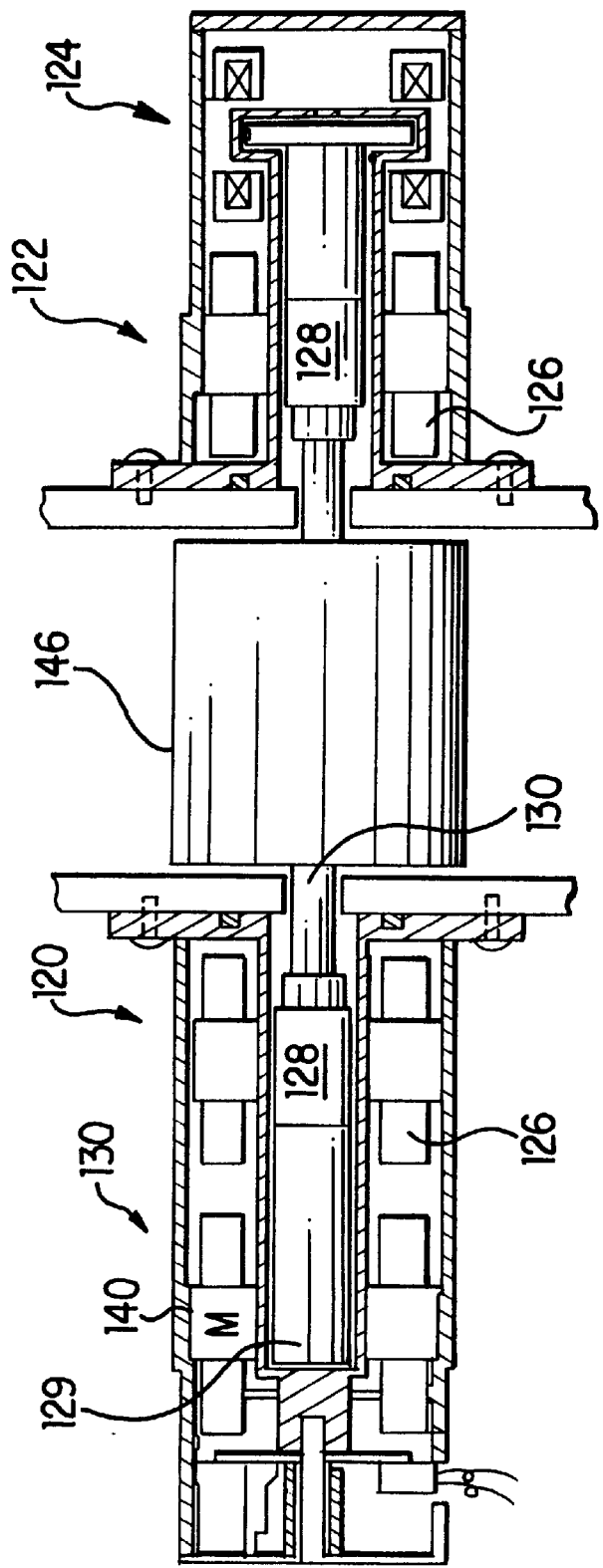
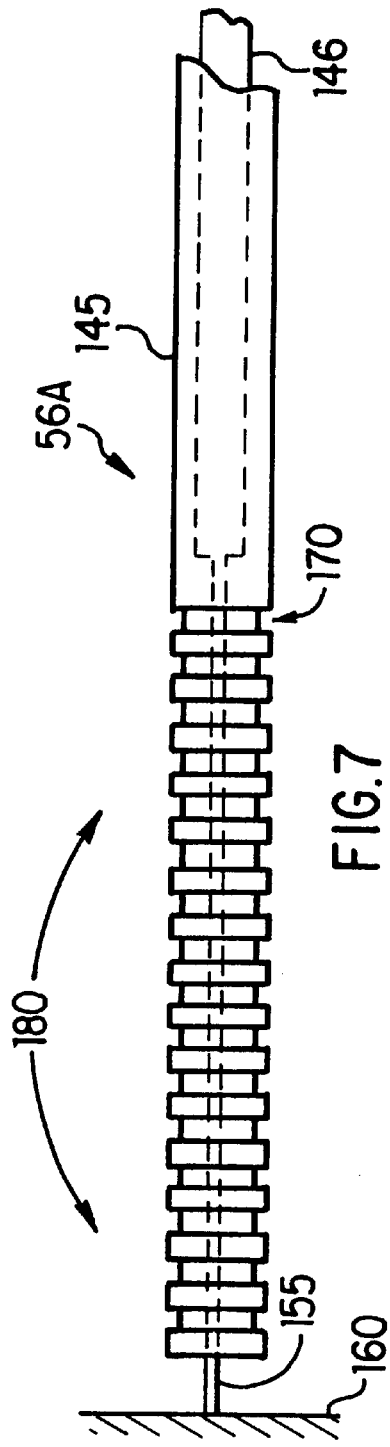
FIG. 5
FIG. 7

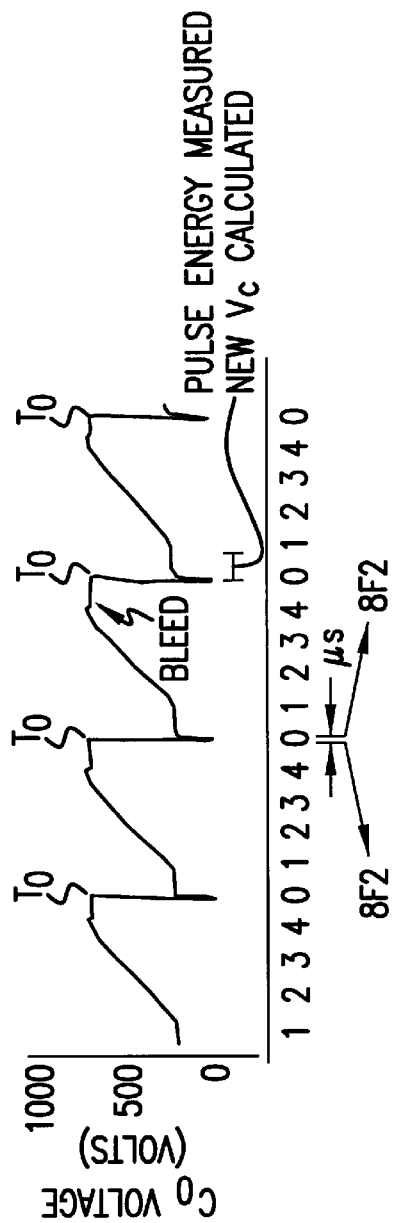
FIG.8F1
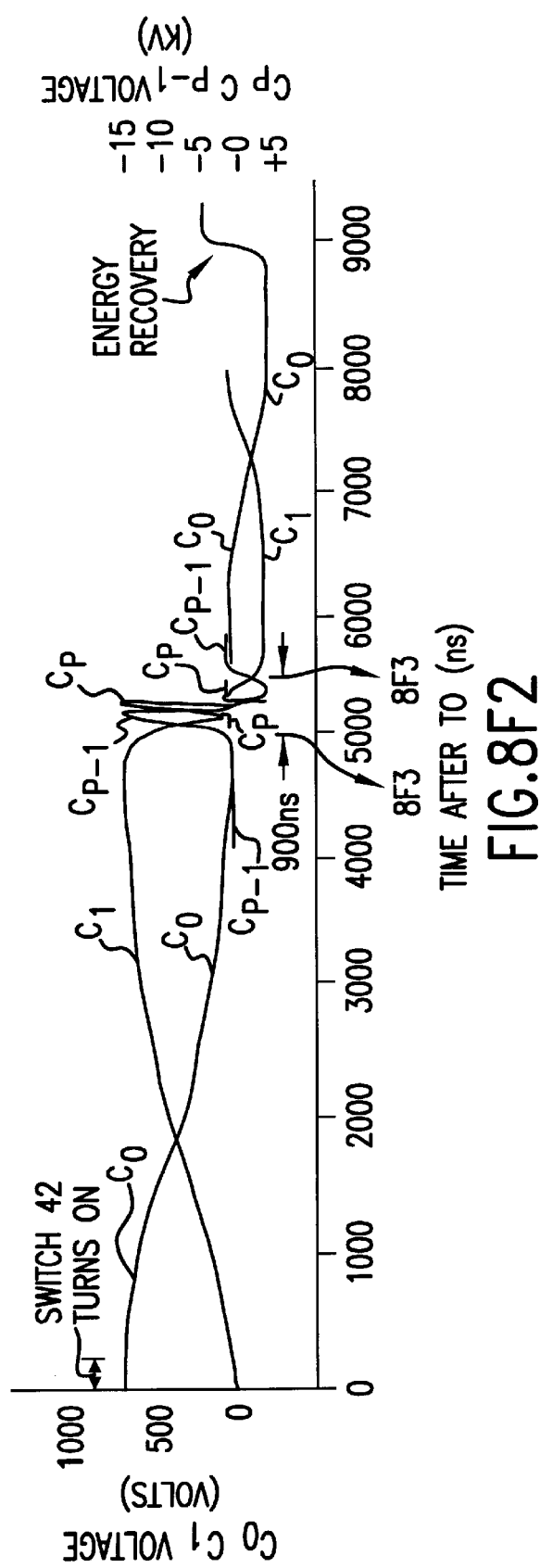
FIG.8F2

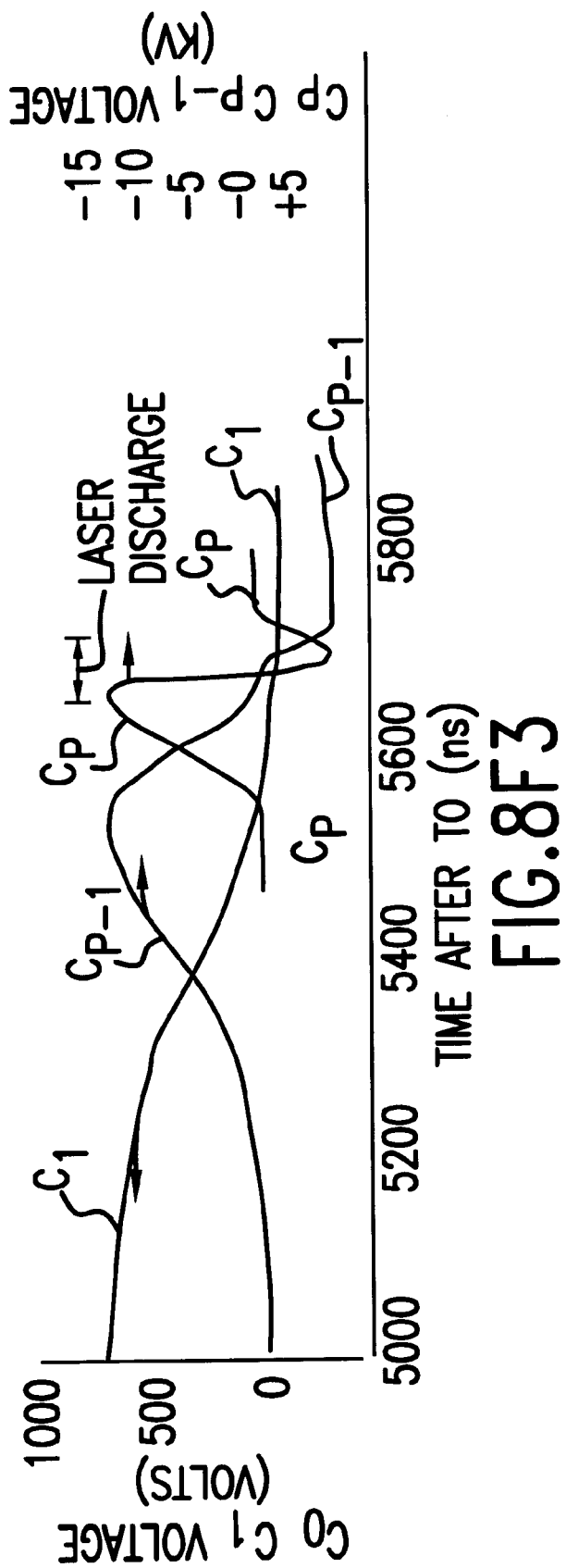
FIG.8F3

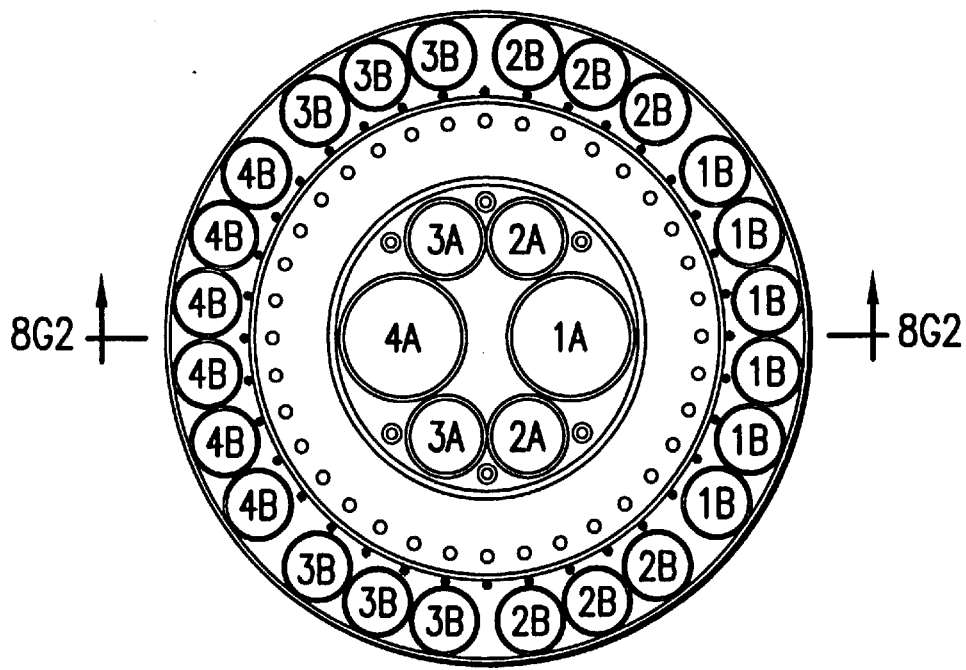
FIG.8G1
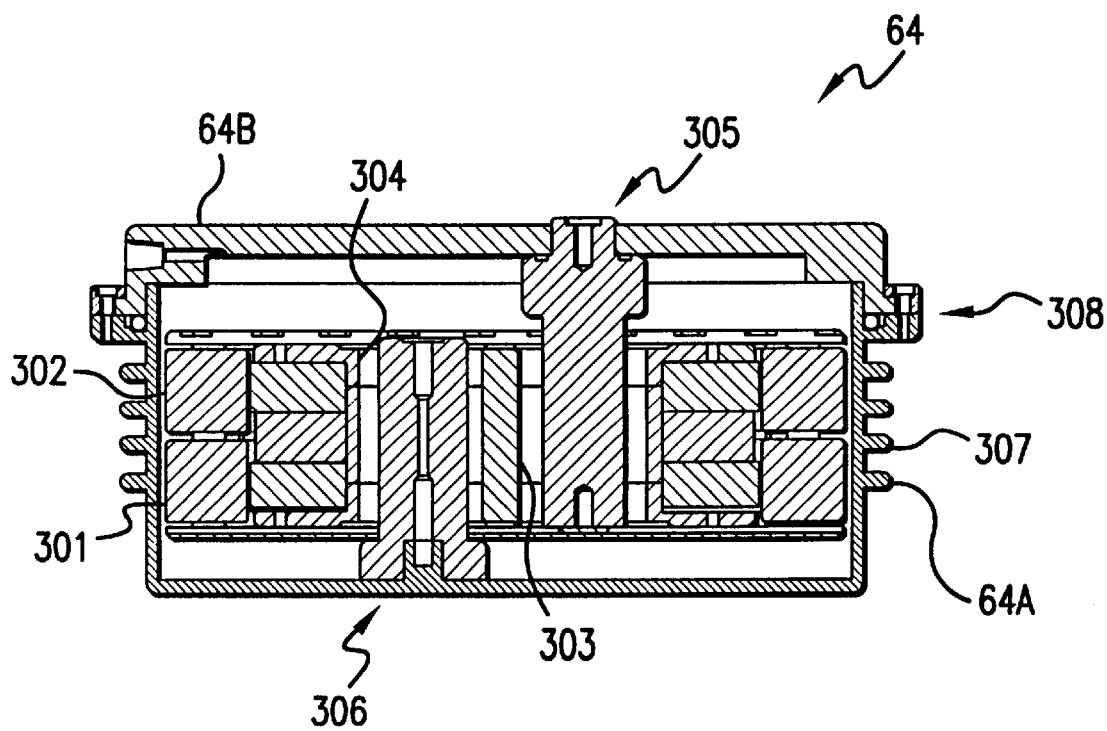
FIG.8G2

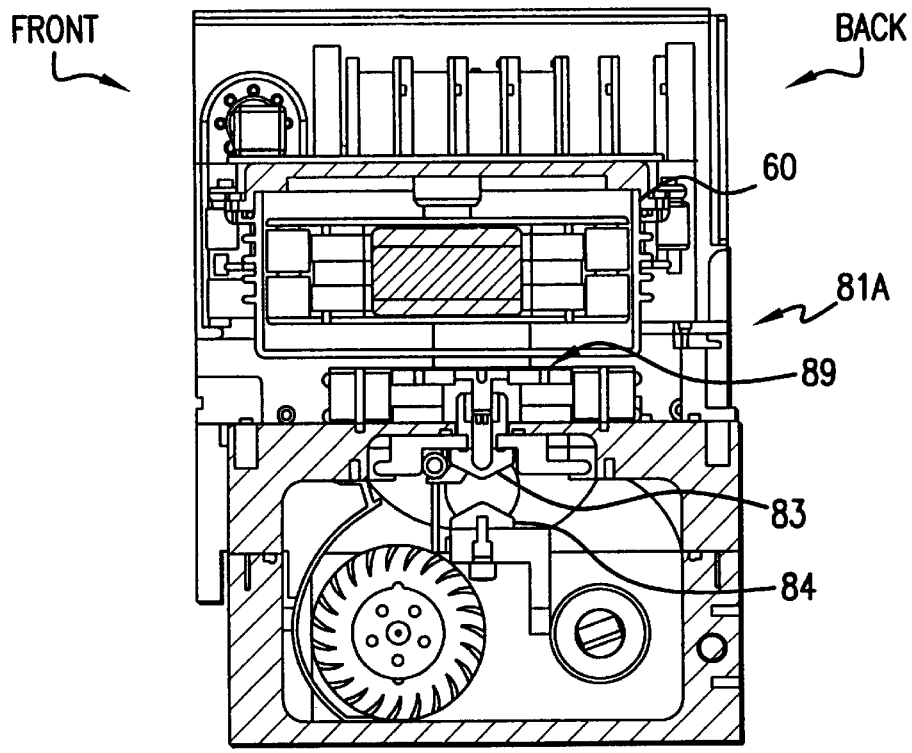
FIG.8H1
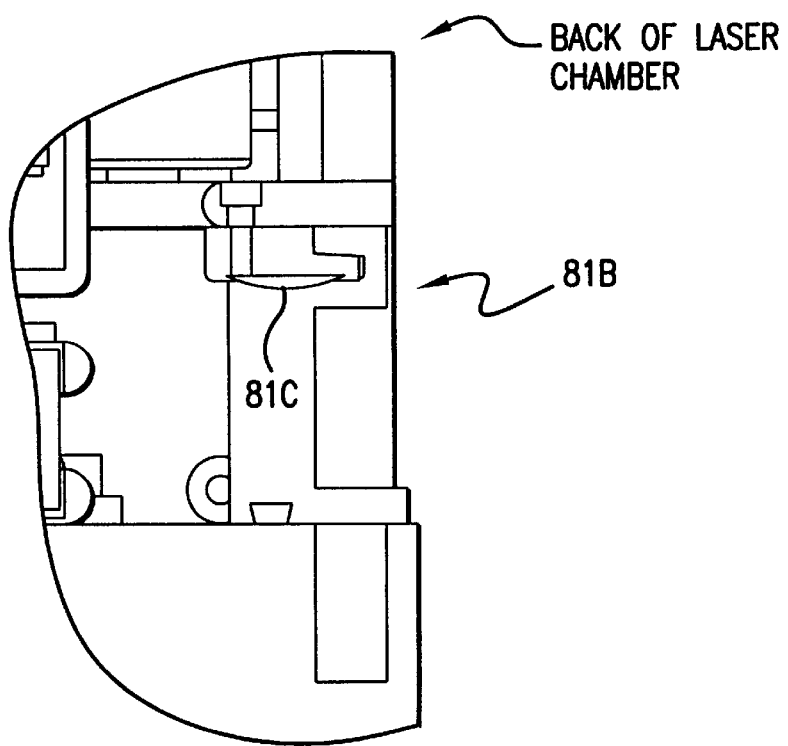
FIG.8H2

RELIABLE MODULAR PRODUCTION QUALITY NARROW-BAND HIGH REP RATE EXCIMER LASER

This Application is a Continuation-In-Part of: High Pulse Rate Pulse Power System Ser. No. 09/118,773, filed Jul. 18, 1998, now U.S. Pat. No. 5,936,988; Reliable, Modular, Production Quality Narrow-Band KrF Excimer Laser Ser. No. 09/041,474, filed Mar. 11, 1998, now U.S. Pat. No. 5,991,324; Pulse Energy Control for Excimer Laser, Ser. No. 09/034,870, filed Mar. 4, 1998, now U.S. Pat. No. 6,005,879; Excimer Laser Having Pulse Power Supply with Fine Digital Regulation, Ser. No. 08/995,832, filed Dec. 22, 1997, now U.S. Pat. No. 5,982,795; Very Narrow-band KrF Laser, Ser. No. 08/842,305, filed Apr. 23, 1997, now U.S. Pat. No. 5,835,520; Excimer Laser with Magnetic Bearings Supporting Fan Ser. No. 08/893,904, filed Jul. 11, 1997, now U.S. Pat. No. 5,848,089; Automatic Fluorine Control System Ser. No. 09/109,596; filed Jul. 2, 1998, now U.S. Pat. No. 6,028,880; all of which are incorporated herein by reference. This invention relates to lasers and in particular to narrow-band KrF excimer lasers.

BACKGROUND OF THE INVENTION

Krypton-Fluoride (KrF) excimer lasers are currently becoming the workhorse light source for the integrated circuit lithography industry. The KrF laser produces a laser beam having a narrow-band wavelength of about 248 nm and can be used to produce integrated circuits with dimensions as small as about 180 nm. The Argon Fluoride (ArF) excimer laser is very similar to the KrF laser. The primary difference is the laser gas mixture and a shorter wavelength of the output beam. Basically, Argon replaces Krypton and the resulting wavelength of the output beam is 193 nm. This permits the integrated circuit dimensions to be further reduced to about 140 nm. A typical prior-art KrF excimer laser used in the production of integrated circuits is depicted in FIG. 1 and FIG. 2. A cross section of the laser chamber of this prior art laser is shown in FIG. 3. A pulse power system 2 powered by high voltage power supply 3 provides electrical pulses to electrodes 6 located in a discharge chamber 8. Typical state-of-the art lithography lasers are operated at a pulse rate of about 1000 Hz with pulse energies of about 10 mJ per pulse. The laser gas (for a KrF laser, about 0.1% fluorine, 1.3% krypton and the rest neon which functions as a buffer gas) at about 3 atmospheres is circulated through the space between the electrodes at velocities of about 1,000 inches per second. This is done with tangential blower 10 located in the laser discharge chamber. The laser gases are cooled with a heat exchanger 11 also located in the chamber and a cold plate (not shown) mounted on the outside of the chamber. The natural bandwidth of the excimer lasers is narrowed by line narrowing module 18. Commercial excimer laser systems are typically comprised of several modules that may be replaced quickly without disturbing the rest of the system. Principal modules include:
Laser Chamber Module,
Pulse Power System with: high voltage power supply module,
commutator module and high voltage compression head module,
Output Coupler Module,
Line Narrowing Module,
Wavemeter Module,
Computer Control Module,
Gas Control Module,
Cooling Water Module These modules are designed for quick replacement as individual units to minimize down time to the laser when maintenance is performed.

Electrodes 6 consist of cathode 6A and anode 6B. Anode 6B is supported in this prior art embodiment by anode support bar 44 which is shown in cross section in FIG. 3. Flow is counterclockwise in this view. One corner and one edge of anode support bar 44 serves as a guide vane to force air from blower 10 to flow between electrodes 6A and 6B. Other guide vanes in this prior art laser are shown at 46, 48 and 50. Perforated current return plate 52 helps ground anode 6B to the metal structure of chamber 8. The plate is perforated with large holes (not shown in FIG. 3) located in the laser gas flow path so that the plate does not substantially affect the gas flow. A peaking capacitor comprised of an array of individual capacitors 19 is charged prior to each pulse by pulse power system 2. During the voltage buildup on the peaking capacitor, two preionizers 56 produce an ion field between electrodes 6A and 6B and as the charge on capacitors reach about 16,000 volts, a discharge across the electrode is generated producing the excimer laser pulse. Following each pulse, the gas flow between the electrodes of about 1 inch per millisecond, created by blower 10, is sufficient to provide fresh laser gas between the electrodes in time for the next pulse occurring one millisecond later.

In a typical lithography excimer laser, a feedback control system measures the output laser energy of each pulse, determines the degree of deviation from a desired pulse energy, and then sends a signal to a controller to adjust the power supply voltage so that energy of subsequent pulses are close to the desired energy. In prior art systems, this feedback signal is an analog signal and it is subject to noise produced by the laser environment. This noise can result in erroneous power supply voltages being provided and can in turn result in increased variation in the output laser pulse energy.

These excimer lasers are typically required to operate continuously 24 hours per day, 7 days per week for several months, with only short outages for scheduled maintenance. One problem experienced with these prior-art lasers has been excessive wear and occasional failure of blower bearings.

A prior art wavemeter utilizes a grating for coarse measurement of wavelength and an etalon for fine wavelength measurement and contains an iron vapor absorption cell to provide an absolute calibration for the wavemeter. This prior art device focuses the coarse signal from the grating onto a linear photo diode array in the center of a set of fringes produced by the etalon. The center fringes produced by the etalon are blocked to permit the photo diode array to detect the coarse grating signal. The prior-art wavemeter cannot meet desired speed and accuracy requirements for wavelength measurements.

Prior-art lasers such as the one discussed above are very reliable, producing billions of pulses before the need for major maintenance, but integrated circuit fabricators are insisting on even faster pulse rates and better performance and reliability. Therefore, a need exists for a reliable, production quality excimer laser system, capable of long-term factory operation at pulse rates of 2000 Hz or faster and having wavelength stability of less than 0.2 pm and a bandwidth of less than 0.6 pm.

SUMMARY OF THE INVENTION

The present invention provides a reliable modular production quality excimer laser capable of producing 10 mJ laser pulses at 2000 Hz with a full width half, maximum bandwidth of about 0.6 pm or less and wavelength stability of less than 0.2 pm. Replaceable modules include a laser chamber; a pulse power system comprised of three modules; an optical resonator comprised of a line narrowing module and an output coupler module; a wavemeter module, an electrical control module, a cooling water module and a gas control module.

Improvements in the laser chamber permitting the higher pulse rates and improved bandwidth performance include a single upstream preionizer tube. The chamber is designed for operation at lower fluorine concentration.

Important improvements have been provided in the pulse power unit to produce faster rise time and improved pulse energy control. These improvements include an increased capacity high voltage power supply with a voltage bleed-down circuit for precise voltage trimming, an improved commutation module that generates a high voltage pulse from the capacitors charged by the high voltage power supply and amplifies the pulse voltage 23 times with a very fast voltage transformer having a secondary winding consisting of a single four-segment stainless steel rod. A novel design for the compression head saturable inductor (referred to herein as a "pots and pans" design) greatly reduces the quantity of transformer oil required and virtually eliminates the possibility of oil leakage which in the past has posed a hazard.

Improvements in the resonance cavity of preferred embodiments of the present invention include a line narrowing module with CaF prism beam expanders and a grating specially coated for UV damage resistance. Preferred embodiments comprised output couplers having substantially increased reflectivity over prior art designs. Other preferred embodiments provide a line narrowing output coupler which may be an etalon operated in a reflection mode where both the grating and the etalon are tuned to provide minimum or approximately minimum reflection back into the laser chamber of light outside a desired wavelength range.

A newly designed wavemeter including a computer processor programmed with an algorithm for controlling wavelength measurements and computing wavelengths at rates sufficient for feedback control of the wavelength of the output laser beam at rates of 2000 Hz or faster.

A new electrical power distribution module with breakers and relays mounted on removable DIN (acronym well-known in the art for *Deutsche Industrie Normenausschuss,* a German standards association, which administers many international electrical and industrial specifications) rails permits quicker and easier service. An ethernet communication system provides very fast digital feedback from and control of the laser equipment. The module includes a computer programmed with a novel algorithm for improved control of pulse energy and burst energy.

A new gas control module includes an improved fluorine injection system with a large manifold designed to provide precisely controlled fluorine injections.

Other embodiments of the present invention include ceramic bearings or magnetic bearings and acoustic baffles. Reaction forces on the bearings may be reduced by providing an aerodynamic contour on the anode support bar.

BRIEF DESCRIPTION OF THE DRAWINGS

FIGS. 4A and 4B are drawings of a preferred embodiment of the present invention.

FIG. 5 is a drawing showing a blower drive unit including magnetic bearings.

FIG. 7 is a drawing showing features of a preferred preionizer tube.

FIGS. 8F1, 8F2 and 8F3 are time line charts showing pulse compression using the above preferred embodiment.

FIGS. 8G1 and 8G2 are drawing showing two views of a saturable inductor.

FIGS. 8H1 and 8H2 shows the mounting of a compression head in a preferred embodiment.

DETAILED DESCRIPTION OF PREFERRED EMBODIMENTS FIRST PREFERRED EMBODIMENT

Figure 1:
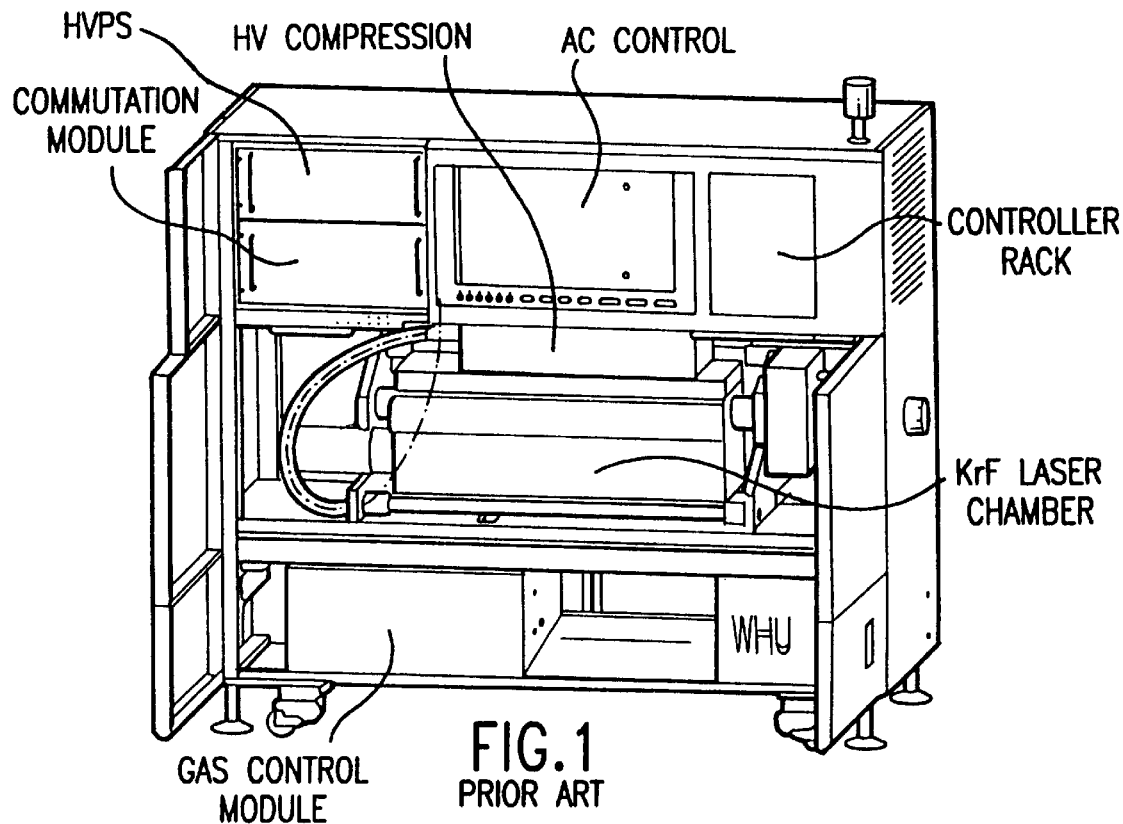
FIG. 1 is a drawing of a prior art commercial excimer lithography laser.

A preferred embodiment of the present invention can be described by reference to the drawings.

MODULAR LASER DESIGN

Front and side cut-away views of a preferred embodiment 1 of the present invention is shown in FIGS. 4A and 4B respectively. This drawing emphasizes the modular nature of their particular invention which allows very quick replacement of modules for repair, replacement and maintenance.

The principal features of this embodiment are listed below corresponding to the reference numbers shown on FIGS. 4A and 4B.

201 Laser enclosure
202 Gas module
203 Cooling water supply module
204 AC/DC distribution module
205 Control module
206 Line narrowing module
207 Compression head
208 High voltage pulse power supply module
209 Commutator module for pulse power supply
210 Metal fluoride trap
211 Laser chamber
212 Blower motor controller
213 Wavemeter module
214 Automatic shutter
215 Mechanical interface and shutter
216 Output coupler
217 Blower motor
218 Metal fluoride trap power supply
219 Status lamp
220 Cooling assembly for compression head
221 Cooling assembly for commutator
222 Gas control flexible connection
223 Chamber support
224 Vent box
225 Cooling assembly for high voltage power supply
227 Mechanical interface gusset
229 Enclosure differential pressure sensor
230 Magnetic bearing idle end
232 CUBIT calibration module
233 Motor cooling fan
234 Magnetic bearing drive end
235 Magnetic bearing controller
236 Blower motor cooling

CHAMBER IMPROVEMENTS

Single Preionizer Tube

Figure 3:
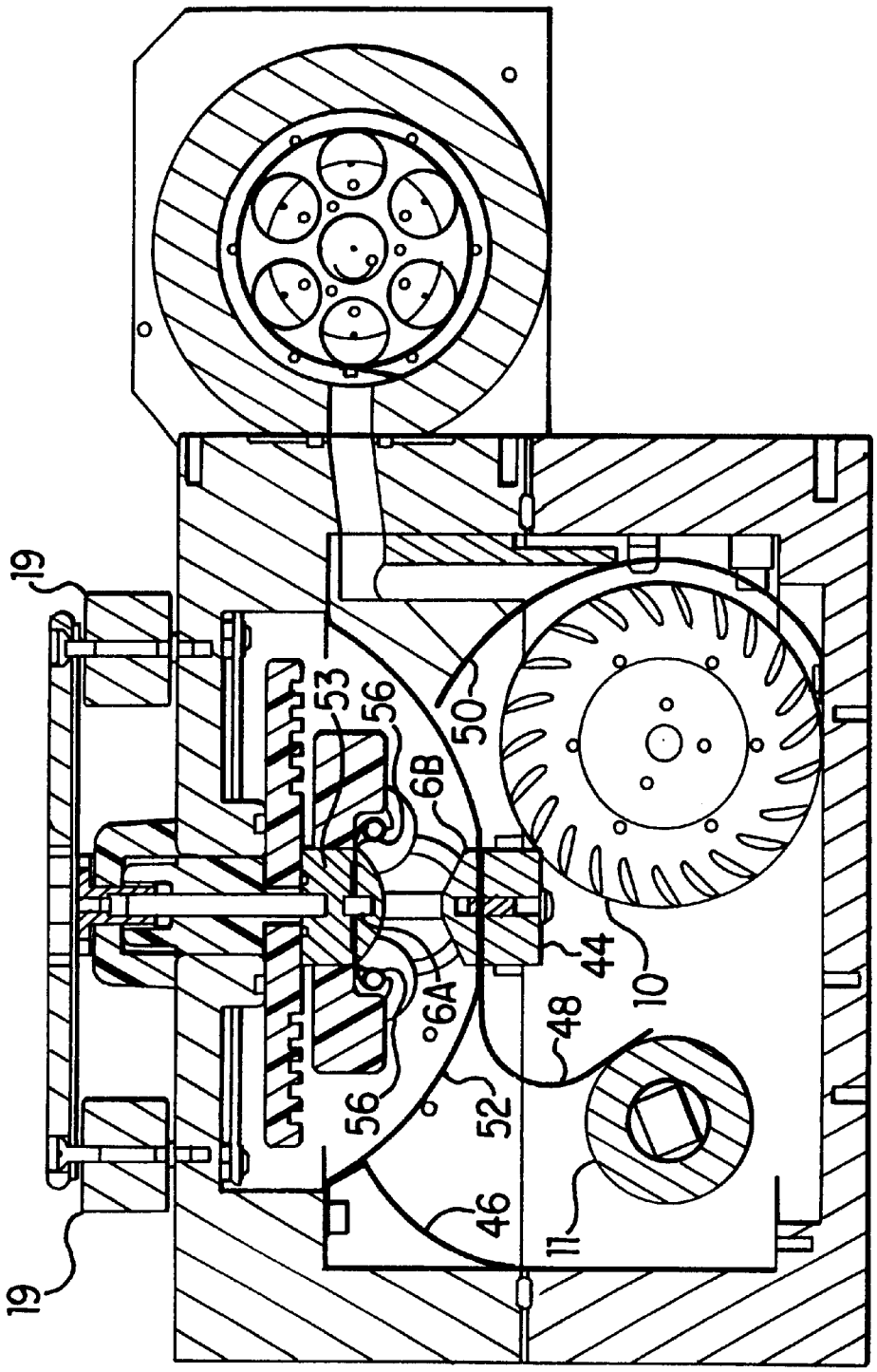
FIG. 3 is a drawing of the laser chamber of the FIG. 2 laser.
Figure 6:
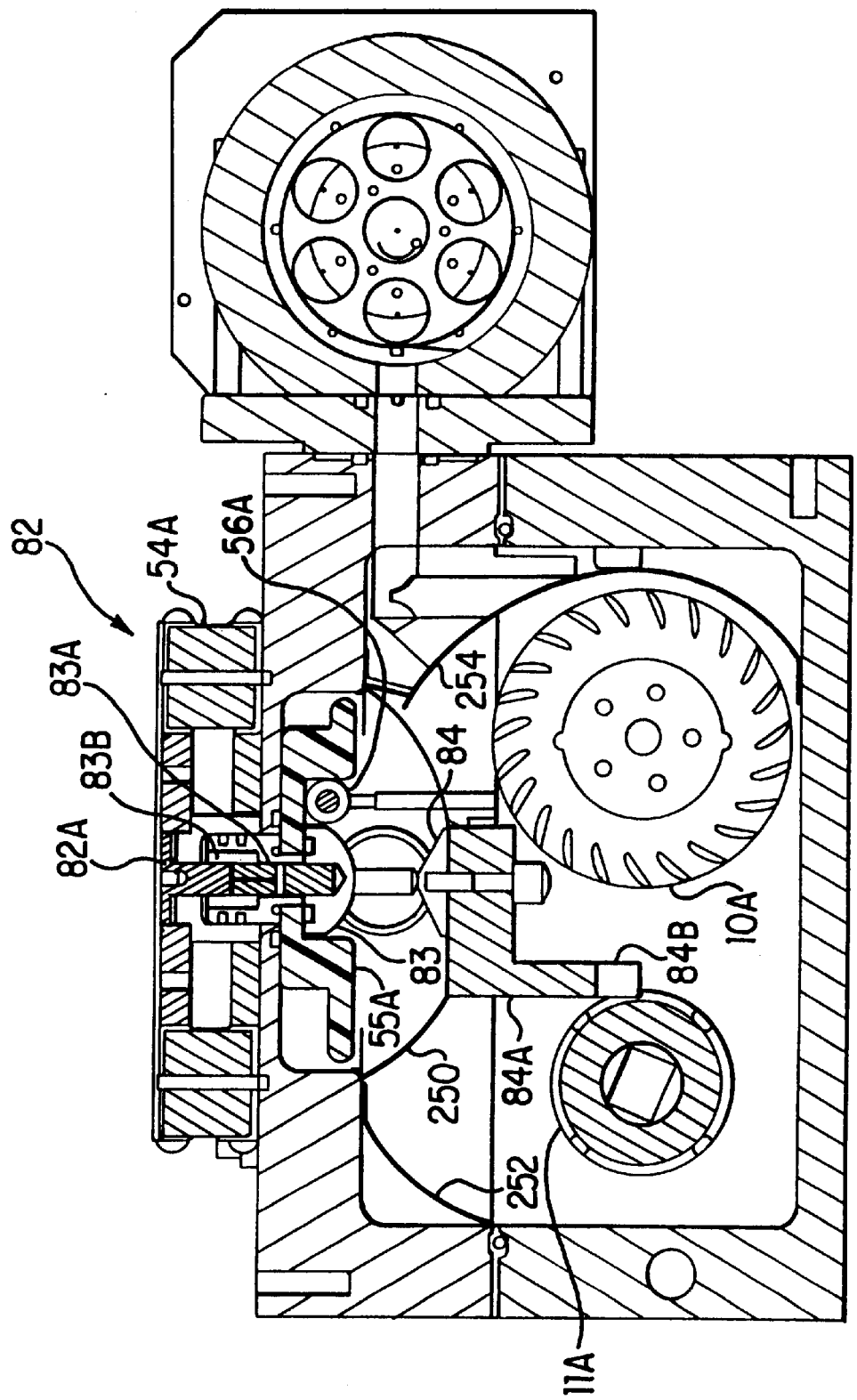
FIGS. 6 and 6A are cross section drawings of laser chambers of preferred embodiments of the present invention.

As shown in FIG. 6, a single larger preionizer tube 56A has replaced the two-preionizer tubes 56 shown in FIG. 3. The single tube preionizer is fabricated in accordance with the description in U.S. Pat. No. 5,719,896, issued Feb. 17, 1998, which is incorporated herein by reference. Applicants have discovered that one preionizer tube is not only sufficient, but very surprisingly provides improved performance over the two-preionizer design. In this embodiment the preionizer is located upstream of the electrodes. Applicants do not fully understand the reason for the improved performance. However, Applicants believe that the prior art downstream preionizers may attract and retard the removal of ions generated in one pulse long enough for those ions to interfere with the next pulse coming (in a 1 to 2 kHz laser) about 0.5 to 1.0 millisecond later. Also, Applicants believe that the one tube preionizer may be a reason for the observed improvement in the pulse-to-pulse stability.

Referring now to FIG. 7, this preionizer utilizes an integrated tube design, having bushing element 180 with anti-tracking grooves 170 incorporated therein as an integral component of the tube. The diameter of the rod portion 145 and the OD of the bushing portion 180 of the preionizer is ½ inch. The inside conductor rod 146 has a diameter of $\frac{7}{37}$ inch and the connecting wire extending through the bushing section to make a ground connection is about $\frac{1}{16}$ inch diameter. Prior designs utilized a two-diameter design, with the rod portion at about ¼ inch diameter and the bushings at about 1 inch diameter. This necessitated, for manufacturing purposes, a bonding process to join the bushing component with the tube component. The constant diameter, thicker tube design is contrary to conventional design rules, which would predict a reduction in ionization due to lower capacitances. In most designs, the tube thickness is dependent upon the dielectric strength of the material selected. Those skilled in the art will recognize that optimum performance for a given tube geometry is conventionally determined by selecting a material with the highest dielectric strength and determining a wall thickness to match this capacity. For example, a sapphire material is known to have a dielectric strength ranging from 1200 volts/mil to 1700 volts/mil. Therefore, for tube 0.035 inches thick, there is a safety factor of 2 if the laser operates at 25 kV. In accordance with the present invention, a material of lesser dielectric strength is utilized in a single piece construction, necessitating a thicker tube wall. This design would theoretically yield a lower capacitance. The actual effect of this reduced capacitance on laser operation, however, was discovered to be negligible, with a surprising increase in the measured geometric irradiation of the electrode gap. Because of the constant diameter, thicker tube wall, integral bushing design, a single piece of material can be machined to provide anti-tracking grooves 170. Furthermore, because of the single piece construction, there is no need to use ultra-pure (i.e., 99.9%) polycrystalline translucent aluminum oxide ceramic; and there is no requirement to perform the difficult surface polishing of tube geometries in preparation for diffusion bonding to artificially create the integral relationship between bushing 180 and tube 145. In fact, it has been determined that high purity is not as important a property as porosity of the material. It has been found that the greater the porosity, the more the dielectric strength is reduced. As a result, a commercial grade ceramic, preferably with purity of at least 99.8% and low porosity, such as that manufactured by Coors Ceramics Company under the material no. AD-998E and having a dielectric strength of 300 volts/mil may be used. Bushings 180, having anti-tracking grooves 170 disposed therein, as previously described, act to prevent high voltage tracking axially along the surface of the tube from the cathode to the ground plane 160.

High Efficiency Chamber

Improvements have been made to the chamber to improve the efficiency of the pulse power system. A single piece cathode insulator 55A as shown in FIG. 6, comprised of alumina, $Al_2O_3$ insulates the cathode from the upper chamber structure. In a prior art design, eight insulators were needed. This important improvement permitted the head portion of the chamber to be made shorter which significantly reduced the distance between cathode 83 the peaking capacitor 82. The individual capacitors 54A forming the peaking capacitor array 82 were moved horizontally in closer to the cathode as compared to the prior art. To reduce thermal expansion difference between the single piece insulator and the chamber structure the upper chamber was fabricated from ASTM A3C steel which has a coefficient of thermal expansion similar to $Al_2O_3$.

Prior art cathodes for commercial lithography lasers were typically supported by a cathode support bar 53 as shown in FIG. 3. In this preferred embodiment, the cathode support bar was eliminated and the cathode 83 was made slightly thicker and mounted directly on the single piece insulator 55A. The cathode 83 is connected to the high voltage side 82A of peaking capacitor 82 by 15 feed through rods 83A and connecting nuts 83B. In the preferred embodiment, a new anode support bar 84A is substantially more massive than prior art anode support bars and comprises fins 84B located in the gas flow region. Both of these features minimize temperature variations of the anode. The more massive anode support bar also improves discharge current flow.

Other improvements were made in the pulse power system to permit the faster rise times needed for 2000 Hz and faster operations. These are discussed below in the section entitled, Pulse Power System.

Metal Seals

Applicants have discovered that prior art elastomer seals reacted with fluorine gas to produce contaminants in the laser gas which degraded laser performance. A preferred embodiment of the present invention uses all metal seals to seal the laser chamber. The preferred metal seals are tin plated inconel 1718 seals. In the case of heat exchanger 11, a metal bellows has been provided which permits thermal expansion and contraction and allows metal seals to be used to seal cooling water inlets.

Monel Current Return and Vanes

Applicants have also discovered that elements of stainless steel also react with fluorine to produce contaminants in the laser gas. Therefore, in this preferred embodiment, prior art stainless steel current return structures and gas flow vanes have been replaced with monel current returns 250 and monel flow vanes 252 and 254.

Braze Free Heat Exchanger

Prior art heat exchanger as shown at 11 in FIG. 3 generally consisted of cooling water tube or tubes having fins brazed to the tube. Applicants have discovered that typical braze material contains impurities such as silicon which reacts with fluorine to produce products which degrade laser performance. Preferred embodiments of the present invention provide a brazed free heat exchanger. In one preferred embodiment the heat exchanger shown at 11A in FIG. 6 is machined with fins in place out of a solid copper 2-inch diameter bar to produce a heat exchanger having a central water tube with a 5/16 inch ID and a 7/16 inch OD with 1/32-inch thick fins extending to the original 2-inch diameter and spaced at 10 fins per inch.

Figure 9A:
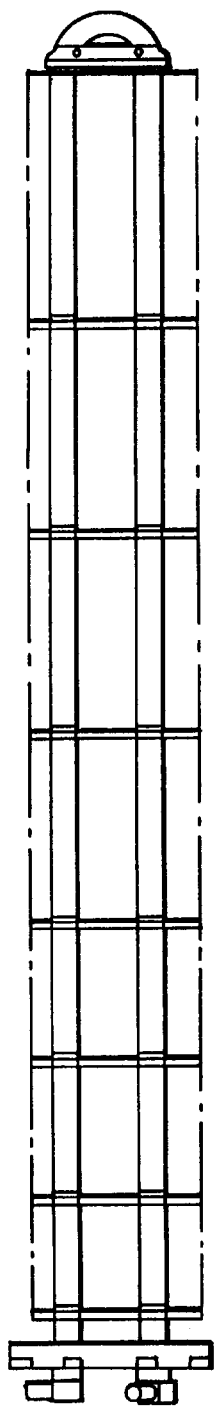
FIGS. 9A and 9B are drawings describing a preferred heat exchanger design.
Figure 9B:
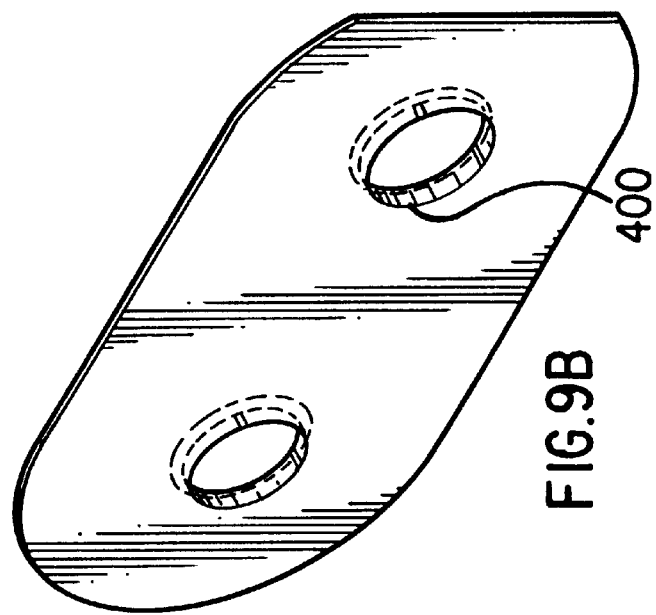

In a second braze free design fins shaped as shown in FIG. 9B each with two 5/16 inch holes are stacked on a 5/16 diameter U-tube as shown in FIG. 9A at about 10 fins per inch and the U-tube is expanded with about 60,000 pounds per square inch by hydraulic pressure to clamp the fins in place on the U-tube. The fins are stamped with compression tabs shown at 400. These tabs compress against the tube when it is expanded to provide good heat transfer between the tube and the fins. The tabs also function as spacers between the fins when the fins are installed on the U-tube.

In a third braze-free design similar to the second design, the fins were welded in place with an electron beam welding process.

Acoustic Baffles

Applicants have discovered that a significant cause of distortion of the quality of laser beams produced by narrow-band KrF excimer lasers operating in the range of 1000 Hz to 2000 Hz or greater is acoustic shock waves created by the electric discharge of one pulse which reflects from elements of chamber structure back to the space between the electrodes and distorts the laser beam of the next pulse occurring 0.5 to 1.0 millisecond later. An embodiment described herein (see FIG. 6A) substantially minimizes this effect by providing angled, grooved acoustic baffles 63A and 64A on both sides of the laser chamber. These baffles absorb a portion of the acoustic energy and reflect a portion of the acoustic energy down into the lower region of the laser chamber away from the electrodes. In this preferred embodiment, the baffles consist of a machined metal structure with grooves 0.1 mil wide, 0.3 mil deep spaced at 0.2 mil intervals; a 0.3 mil deep groove is shown at 61A in baffle 63A in FIG. 6A. These baffles have been shown by actual testing to substantially reduce pulse quality distortion caused by acoustic shock waves.

Fan Improvements

This preferred embodiment of the present invention includes major improvements in the prior art gas circulator which has greatly improved laser performance in addition to providing the gas flow needed to 2,000 Hz operation. These improvements are in the construction of a braze free blower blade structure. A new non-symmetrical blade arrangement greatly decreases resonance effects and improved bearings.

Silicon Free Fan Blade Structure

Applicants have discovered that a brazing material commonly used in blower blade construction was the primary source of $SiF_6$ in the laser chamber. This gas significantly degraded laser performance. Applicants have identified four solutions to this problem. First the blade structure was machined in segments from a solid block of material (in this case aluminum). Another solution was to cast the blade structure in segments. The segments then are welded together using electron beam welding in which no new material is added. It is also feasible to fabricate the blade structure by joining blades to a frame structure but in this case the joining is by electron beam welding instead of the prior art brazing process. The fourth method is to join the blade to a frame structure using a soldering process using a silicon free solder. Aluminum 6061 is used as the base material for all of the component pieces. These parts are then copper-plated in prelude to the soldering process. With all of the parts assembled, the fan is then soldered together using a low temperature solder, typically 91% tin (Sn) and 9% Zinc (Zn) in a vacuum furnace. This solder is chosen due to its lack of silicon and its ability to work with aluminum (Cu-plated). The assembled and soldered fan is then nickel-plated. This method of construction yields a non-silicon fan that is inexpensive to manufacture.

Reducing Resonance Effects

Prior art blower blade structures consisted of a tangential blower with 23 longitudinal blades. These blades were mounted symmetrically at the circumference of the structure. Substantial resonance effects were measured both with respect to fan parameters and actual laser performance. Perturbations in the laser beam were shown to correspond to acoustic waves at 23 times the rotating frequency of the fan. Adverse effects on bearing performance were also measured corresponding to 23 times the fan's rotating frequency.

Figure 14B:
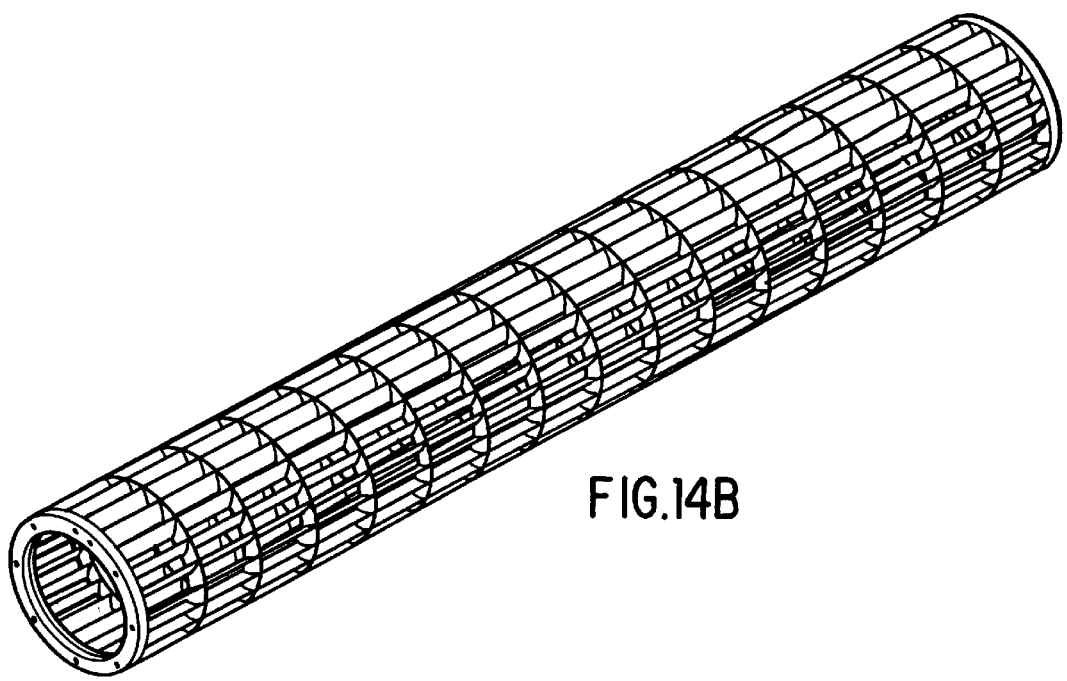
FIGS. 14A, 14B and 14C show preferred blower blade structure designs.
Figure 14A:
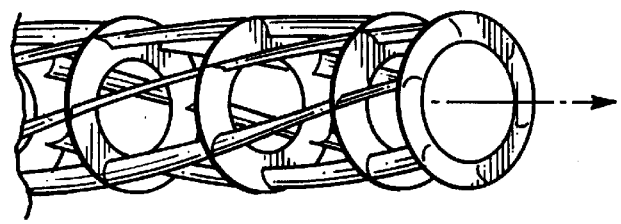
Figure 14C:
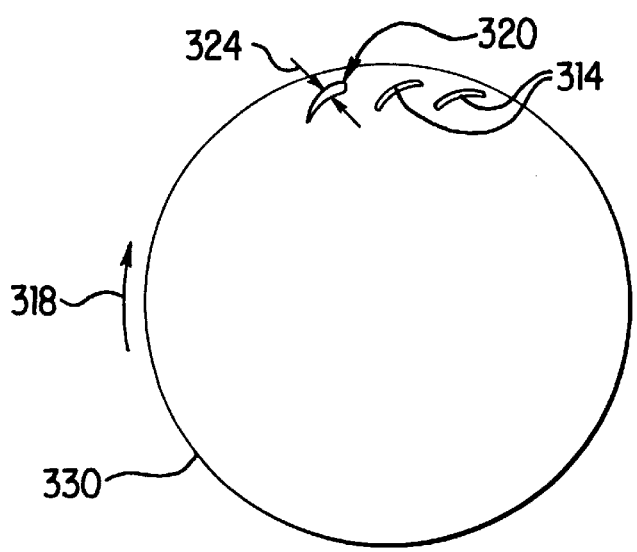

Improvements in fan structure design call for a non symmetrical blade arrangement such as that shown in FIG. 14A. An alternative as shown in FIG. 14B where the fan blade structure is formed of 16 separate machined or cast segments with each segment having 23 blades is to rotate each segment by $360°/(15×23)$ or about 1° relative to the adjacent segment. Another improvement which is made relatively easy in the machine or cast approach to fan blade structure fabrication is to form the blades into air foils as shown at 320 in FIG. 14C. Prior art blades were stamped and a cross section of the two of the stamped blades are shown for comparison at 314. The direction of rotation is shown at 318 and 330 represents the circumference of the blade structure. Whereas conventional blades are uniform in thickness, airfoil blades have a tear shape profile including a rounded leading edge, a thickened midsection and a tapered trailing edge.

Bearing Improvements

The present invention will be made available with two alternative bearing improvements over the prior art.

Ceramic Bearings

A preferred embodiment of the present invention includes ceramic bearings. The preferred ceramic bearings are silicon nitride lubricated with a synthetic lubricant, preferably perfluoropolyalkylether (PFPE). These bearings provide substantially greater life as compared to prior art excimer laser fan bearings. In addition, neither the bearings nor the lubricant are significantly affected by the highly reactive fluorine gas.

Magnetic Bearings

Another preferred embodiment of the present invention comes with magnetic bearings supporting the fan structure as shown in FIG. 5. In this embodiment, the shaft 130 supporting the fan blade structure 146 is in turn supported by an active magnetic bearing system and driven by a brushless DC motor 130 in which the rotor 129 of the motor and the rotors 128 of at least two bearings are sealed within the gas environment of the laser cavity and the motor stator 140 and the coils 126 of the magnetic bearing magnets are located outside the gas environment. This preferred bearing design also includes an active magnetic thrust bearing 124 which also has the coils located outside the gas environment.

Aerodynamic Anode Support Bar

Figure 6A:
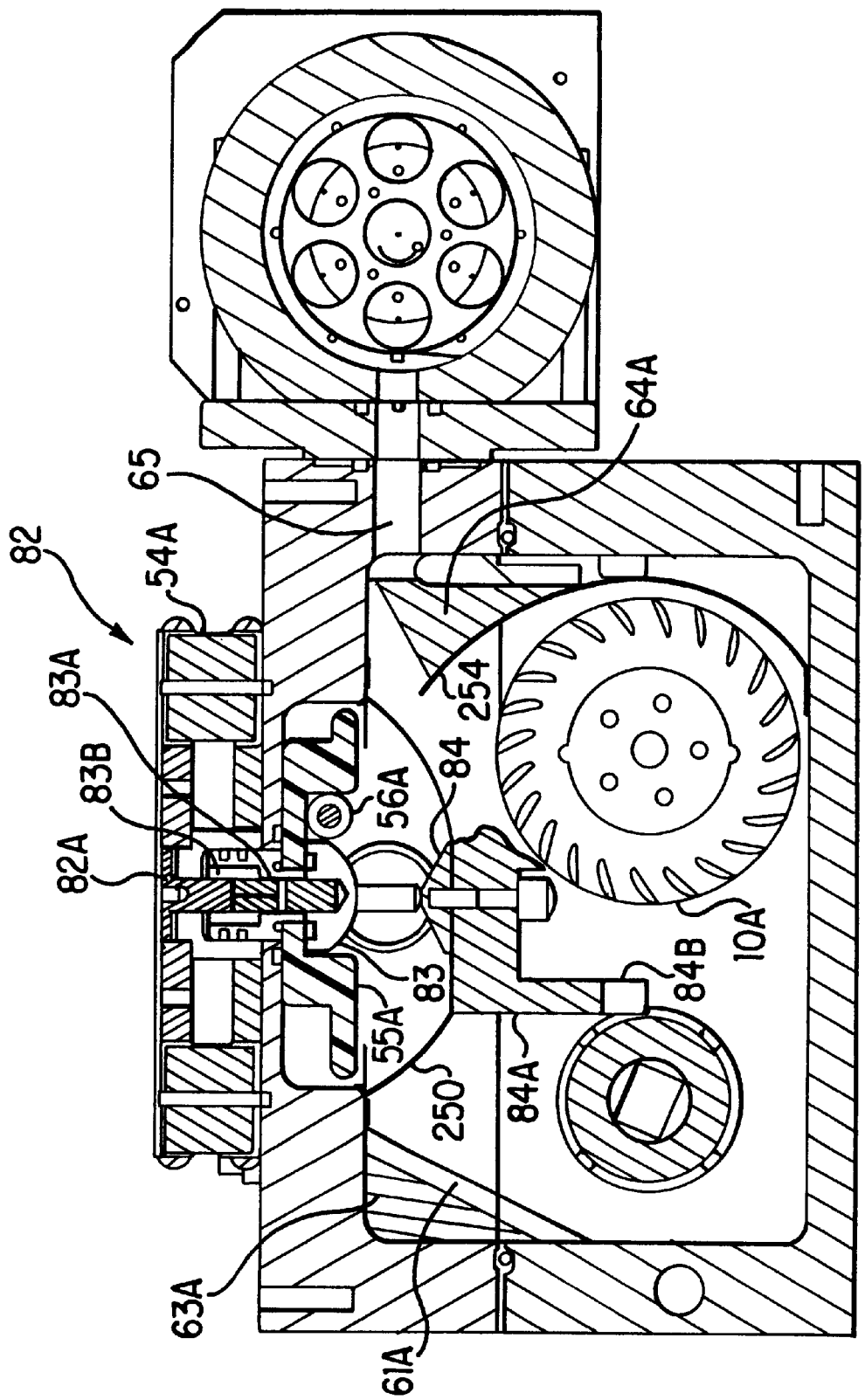

As shown in FIG. 3, prior art gas flow from blower 10 was forced to flow between electrodes 6A and 6B by anode support bar 44. However, Applicants have discovered that the prior art designs of support bar 44 such as that shown in FIG. 3 produced substantial aerodynamic reaction forces on the blower which were transferred to the blower bearings resulting in chamber vibration. Applicants suspect that these vibrational forces are responsible for blower bearing wear and possibly occasional bearing failures. Applicant has tested other designs, several of which are shown in FIGS. 12A–12E, all of which reduced the aerodynamic reaction forces by distributing over a longer time period, the reaction force resulting each time a blade passes close to the edge of support bar 44. One of Applicants preferred anode support bar design is shown in FIG. 6A at 84A. This design has substantially greater mass which minimizes anode temperature swings. The total mass of the anode and the anode support bar is about 3.4 Kg. Also, this design comprises fins 84B which provides added cooling for the anode. Applicants tests have indicated that both the acoustic baffles and the aerodynamic anode support bar tend to reduce slightly the gas flow so that gas flow is limited therefore, the utilization of these two improvements should involve a trade-off analysis. For these reasons two improvements are shown on FIG. 6A and not FIG. 6.

PULSE POWER SYSTEM

Functional Description of Four Pulse Power Modules

Figure 8A:
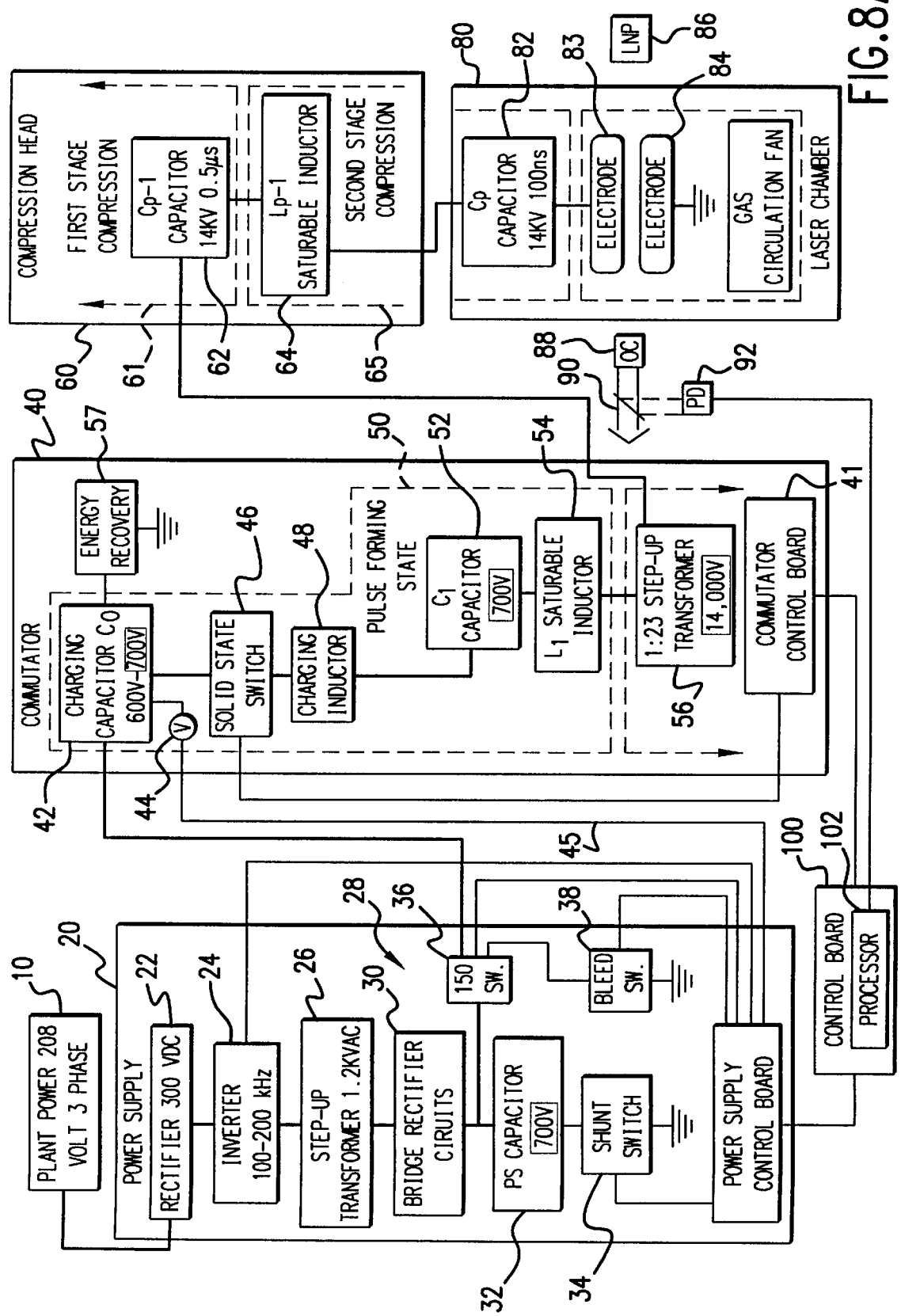
FIG. 8A is a block diagram of a pulse power system of the preferred embodiment of the present invention.
Figure 8B:
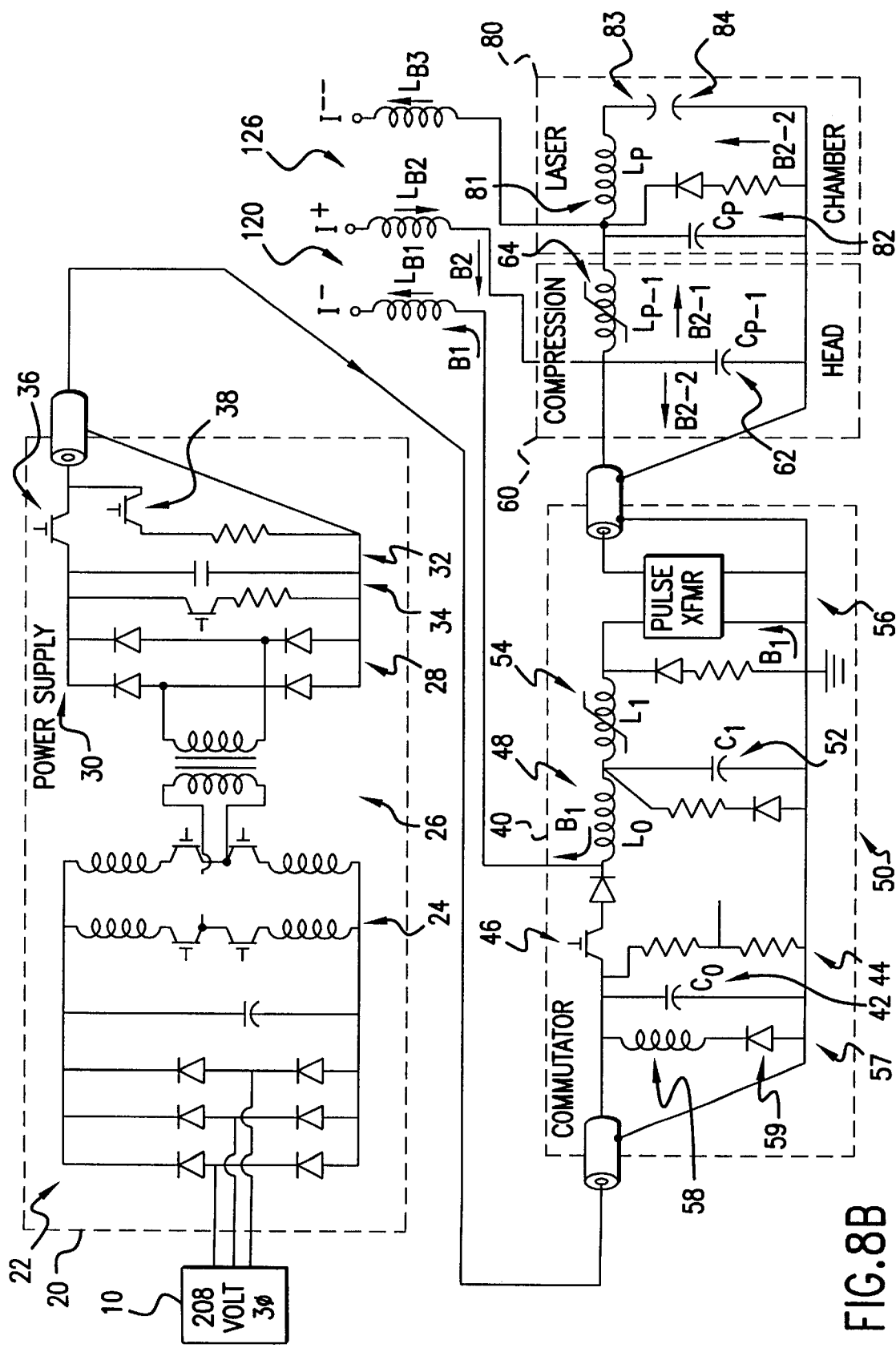
FIG. 8B is a simplified circuit diagram of the above preferred embodiment.

A preferred pulse power system is manufactured in four separate modules as indicated in FIGS. 8A and 8B, each of which becomes an important part of the excimer laser system and each of which can be quickly replaced in the event of a parts failure or in the course of a regular preventative maintenance program. These modules are designated by Applicants: high voltage power supply module 20, commutator module 40, compression head module 60 and laser chamber module 80.

High Voltage Power Supply Module

High voltage power supply module 20 comprises a 300 volt rectifier 22 for converting 208 volt three phase plant power from source 10 to 300 volt DC. Inverter 24 converts the output of rectifier 22 to high frequency 300 volt pulses in the range 100 kHz to 200 kHz. The frequency and the on period of inverter 24 are controlled by the HV power supply control board 21 in order to provide course regulation of the ultimate output pulse energy of the system. The output of inverter 24 is stepped up to about 1200 volts in step-up transformer 26. The output of transformer 26 is converted to 1200 volts DC by rectifier 28 which includes a standard bridge rectifier circuit 30 and a filter capacitor 32. DC electrical energy from circuit 30 charges 8.1 $\mu$F $C_o$ charging capacitor 42 in commutator module 40 as directed by HV power supply control board 21 which controls the operation of inverter 24 as shown in FIG. 8A. Set points within HV power supply control board 21 are set by laser system control board 100.

The reader should note that in this embodiment as shown in FIG. 8A that pulse energy control for the laser system is provided by power supply module 20. The electrical circuits in commutator 40 and compression head 60 merely serve to utilize the electrical energy stored on charging capacitor 42 by power supply module 20 to form at the rate of 2,000 times per second an electrical pulse, to amplify the pulse voltage and to compress in time the duration of the pulse. As an example of this control, FIG. 8A indicates that processor 102 in control board 100 has controlled the power supply to provide precisely 700 volts to charging capacitor 42 which during the charging cycle is isolated from the down stream circuits by solid state switch 46. The electrical circuits in commutator 40 and compression head 60 will upon the closure of switch 46 very quickly and automatically convert the electrical energy stored on capacitor 42 into the precise electrical discharge pulse across electrodes 83 and 84 needed to provide the next laser pulse at the precise energy needed as determined by processor 102 in control board 100.

Commutator Module

Commutator module 40 comprises $C_o$ charging capacitor 42, which in this embodiment is a bank of capacitors connected in parallel to provide a total capacitance of 8.1 $\mu$F. Voltage divider 44 provides a feedback voltage signal to the HV power supply control board 21 which is used by control board 21 to limit the charging of capacitor 42 to the voltage (called the "control voltage") which when formed into an electrical pulse and compressed and amplified in commutator 40 and compression head 60 will produce the desired discharge voltage on peaking capacitor 82 and across electrodes 83 and 84.

In this embodiment (designed to provide electrical pulses in the range of about 3 Joules and 14,000 volts at a pulse rate of 2,000 pulses per second), about 250 microseconds (as indicated in FIG. 8F1) are required for power supply 20 to charge the charging capacitor 42 to 700 volts. Therefore, charging capacitor 42 is fully charged and stable at the desired voltage when a signal from commutator control board 41 closes solid state switch 44 which initiates the very fast step of converting the 3 Joules of electrical energy stored on charging capacitor $C_o$ into a 14,000 volt discharge across electrodes 83 and 84. For this embodiment, solid state switch 46 is a IGBT switch, although other switch technologies such as SCRs, GTOs, MCTs, etc. could also be used. A 600 nH charging inductor 48 is in series with solid state switch 46 to temporarily limit the current through switch 46 while it closes to discharge the $C_o$ charging capacitor 42.

Pulse Generation Stage

Figure 2:
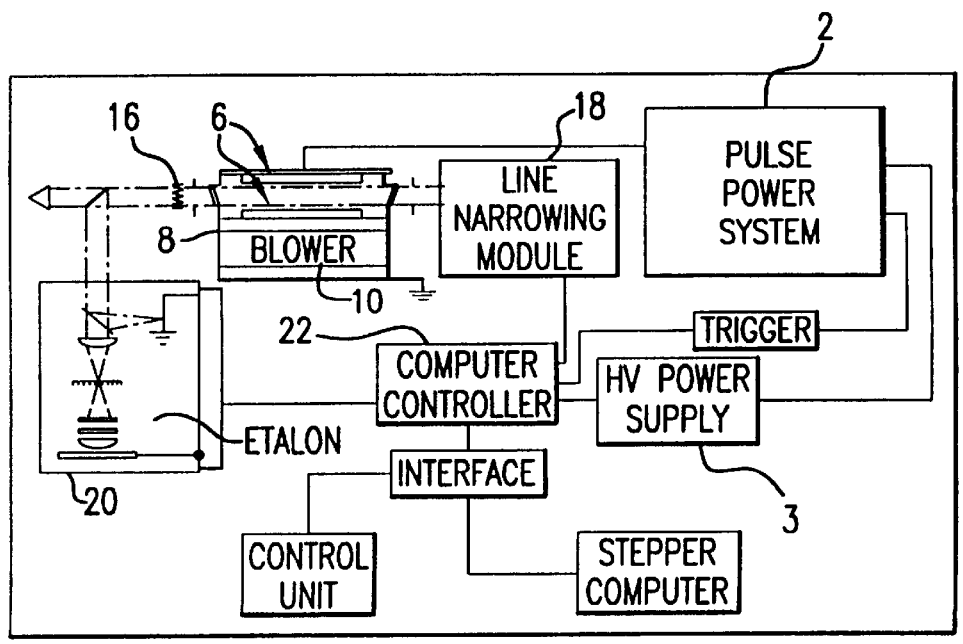
FIG. 2 is a block diagram showing some of the principal elements of a prior art commercial excimer lasers used for integrated circuit lithography.

For the first stage of pulse generation 50, the charge on charging capacitor 42 is thus switched onto $C_1$ 8.5 μF capacitor 52 in about 5 μs as shown on FIG. 8F2.

First Stage of Compression

A saturable inductor 54 initially holds off the voltage stored on capacitor 52 and then becomes saturated allowing the transfer of charge from capacitor 52 through 1:23 step up pulse transformer 56 to $C_{p-1}$ capacitor 62 in a transfer time period of about 550 ns, as shown on FIG. 8F3, for a first stage of compression 61.

The design of pulse transformer 56 is described below. The pulse transformer is extremely efficient transforming a 700 volt 17,500 ampere 550 ns pulse rate into a 16,100 volt, 760 ampere 550 ns pulse which is stored very temporarily on $C_{p-1}$ capacitor bank 62 in compression head module 60.

Compression Head Module

Compression head module 60 further compresses the pulse.

Second Stage of Compression

An $L_{p-1}$ saturable inductor 64 (with about 125 nH saturated inductance) holds off the voltage on 16.5 nF $C_{p-1}$ capacitor bank 62 for approximately 550 ns then allows the charge on $C_{p-1}$ to flow (in about 100 ns) onto 16.5 nF Cp peaking capacitor 82 located on the top of laser chamber 80 and which is electrically connected in parallel with electrodes 83 and 84 and preionizer 56A. This transformation of a 550 ns long pulse into a 150 ns long pulse to charge Cp peaking capacitor 82 makes up the second and last stage of compression as indicated at 65 on FIG. 8A.

Laser Chamber Module

About 100 ns after the charge begins flowing onto peaking capacitor 82 mounted on top of and as a part of the laser chamber module 80, the voltage on peaking capacitor 82 has reached about 14,000 volts and discharge between the electrodes begins. The discharge lasts about 50 ns during which time lasing occurs within the optical resonance chamber of the excimer laser. The optical resonance chamber described in detail below is defined by a line narrowing package 86 comprised in this example by a 3-prism beam expander, a tuning mirror and an eschelle grating and an output coupler 88. The laser pulse for this laser is a narrow band, 20 to 50 ns, 248 nm pulse of about 10 mJ and the repetition rate is 2000 pulses per second. The pulses define a laser beam 90 and the pulses of the beam are monitored by photodiode 92, all as shown in FIG. 8A.

Control of Pulse Energy

The signal from photodiode 94 is transmitted to processor 102 in control board 100 and the processor uses this energy signal and preferably other historical pulse energy data (as discussed below in the section entitled Pulse Energy Control Algorithm) to set the command voltage for the next and/or future pulses. In a preferred embodiment in which the laser operates in a series of short bursts (such as 100 pulse 0.5 second bursts at 2000 Hz separated by a dead time of about 0.1 second) processor 102 in control board 100 is programmed with a special algorithm which uses the most recent pulse energy signal along with the energy signal of all previous pulses in the burst along with other historical pulse profile data to select a control voltage for the subsequent pulse so as to minimize pulse-to-pulse energy variations and also to minimize burst-to-burst energy variations. This calculation is performed by processor 102 in control board 100 using this algorithm during a period of about 35 μs. The laser pulses occurs about 5 μs following the $T_o$ firing of IGBT switch 46 shown on FIG. 8F3 and about 20 μs are required to collect the laser pulse energy data. (The start of the firing of switch 46 is called $T_o$.) Thus, a new control voltage value is thus ready (as shown on FIG. 8F1) about 70 microseconds after the firing of IGBT switch 46 for the previous pulse (at 2,000 Hz the firing period is 500 μs). The features of the energy control algorithm are described below and are described in greater detail in U.S. patent application Ser. No. 09/034,870 which is incorporated herein by reference.

Energy Recovery

This preferred embodiment is provided with electronic circuitry which recovers excess energy onto charging capacitor 42 from the previous pulse. This circuitry substantially reduces waste energy and virtually eliminates after ringing in the laser chamber 80.

The energy recovery circuit 57 is comprised of energy recovery inductor 58 and energy recovery diode 59, connected in series across Co charging capacitor 42 as shown in FIG. 8B. Because the impedance of the pulse power system is not exactly matched to that of the chamber and due to the fact that the chamber impedance varies several orders of magnitude during the pulse discharge, a negative going "reflection" is generated from the main pulse which propagates back from the chamber towards the front end of the pulse generating system. After the excess energy has propagated back through the compression head 60 and the commutator 40, switch 46 opens up due to the removal of the trigger signal by the controller. The energy recovery circuit 57 reverses the polarity of the reflection which has generated a negative voltage on the charging capacitor 42 through resonant free wheeling (a half cycle of ringing of the L-C circuit made up of the charging capacitor 42 and the energy recovery inductor 58) as clamped against reversal of current in inductor 58 by diode 59. The net result is that substantially all of the reflected energy from the chamber 80 is recovered from each pulse and stored on charging capacitor 42 as a positive charge ready to be utilized for the next pulse. FIG. 8F1, 2 and 3 are time line charts showing the charges on capacitor Co, $C_1$, $C_{p-1}$ and Cp. The charts show the process of energy recovery on Co.

Magnetic Switch Biasing

In order to completely utilize the full B-H curve swing of the magnetic materials used in the saturable inductors, a DC bias current is provided such that each inductor is reverse saturated at the time a pulse is initiated by the closing of switch 46.

In the case of the commutator saturable inductors 48 and 54, this is accomplished by providing a bias current flow of approximately 15A backwards (compared to the directional normal pulse current flow) through the inductors. This bias current is provided by bias current source 120 through isolation inductor LB1. Actual current flow travels from the power supply through the ground connection of the commutator, through the primary winding of the pulse transformer, through saturable inductor 54, through saturable inductor 48, and through isolation inductor LB1 back to the bias current source 120 as indicated by arrows B1.

In the case of compression head saturable inductor, a bias current B2 of approximate 5A is provided from the second bias current source 126 through isolation inductor LB2. At the compression head, the current splits and the majority B2-1 goes through saturable inductor Lp-1 64 and back through isolation inductor LB3 back to the second bias current source 126. A smaller fraction of the current B2-2 travels back through the HV cable connecting the compression head 60 and the commutator 40, through the pulse transformer secondary winding to ground, and through a biasing resistor back to the second bias current source 126. This second smaller current is used to bias the pulse transformer so that it is also reset for the pulsed operation. The mount of current which splits into each of the two legs is determined by the resistance in each path and is intentionally adjusted such that each path receives the correct amount of bias current.

Direction of Current Flow

In this embodiment, we refer to the flow of pulse energy through the system from a standard three-phase power source 10 to the electrodes and to ground beyond electrode 84 as "forward flow" and this direction as the forward direction. When we refer to an electrical component such as a saturable inductor as being forward conducting we mean that it is biased into saturation to conduct "pulse energy" in a direction toward the electrodes. When it is reverse conducting it is biased into saturation to conduct energy in a direction away from the electrodes toward the charging capacitor. The actual direction of current flow (or electron flow) through the system depends on where you are within the system. The direction of current flow is now explained to eliminate this as a possible source of confusion.

By reference to FIGS. 8A and 8B, in this preferred embodiment Co capacitor 42 is charged with (for example) a positive 700 volts such that when switch 46 is closed current flows from capacitor 42 through inductor 48 in a direction toward $C_1$ capacitor 52 (which means that electrons are actually flowing in the reverse direction). Similarly, the current flow is from $C_1$ capacitor 52 through the primary side of pulse transformer 56 toward ground. Thus, the direction of current and pulse energy is the same from charging capacitor 42 to pulse transformer 56. As explained below under the section entitled "Pulse Transformer" current flow in both the primary loops and the secondary loop of pulse transformer 56 is toward ground. The result is that current flow between pulse transformer 56 and the electrodes during the initial portion of the discharge (which represents the main portion [typically about 80 percent] of the discharge) is in the direction away from the electrodes toward transformer 56. Therefore, the direction of electron flow during the main discharge is from ground through the secondary of pulse transformer 56 temporarily onto $C_{p-1}$ capacitor 62 through inductor 64, temporarily onto Cp capacitor 82, through inductor 81, through electrode 84 (which is referred to as the discharge cathode) through the discharge plasma, through electrode 83 and back to ground. Thus, between pulse transformer 56 and the electrodes 84 and 83 during the main discharge electrons flow in the same direction as the pulse energy. Immediately following the main portion of the discharge, currents and electron flow are reversed and the reverse electron flow is from ground up through the grounded electrode 84, though the discharge space between the electrodes to electrode 83 and back through the circuit through transformer 56 to ground. The passage of reverse electron flow through transformer 56 produces a current in the "primary" loops of transformer 56 with electron flow from ground through the "primary" side of pulse transformer 56 (the same direction as the current flow of the main pulse) to ultimately charge Co negative as indicated qualitatively in FIG. 8F2. The negative charge on Co is reversed as shown in FIG. 8F2 and explained above in the section entitled Energy Recovery.

DETAILED DESCRIPTION OF PULSE POWER COMPONENTS

Power Supply

Figure 8C:
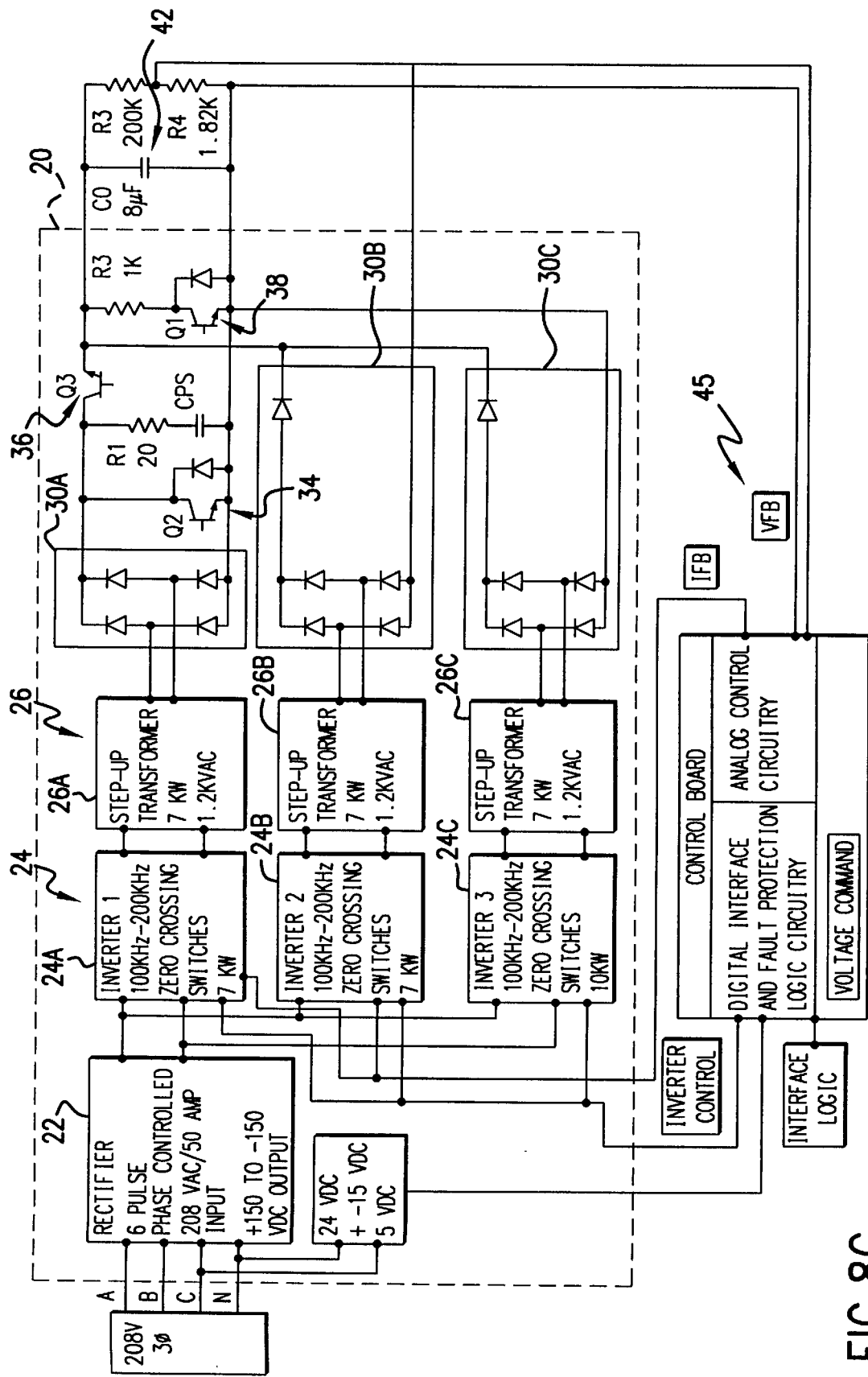
FIG. 8C is a combination block diagram, circuit diagram of a high voltage power supply which is part of the above preferred embodiment.

A more detailed circuit diagram of the power supply portion of the preferred embodiment is shown in FIG. 8C. As indicated in FIG. 8C, rectifier 22 is a 6 pulse phase controlled rectifier with a plus 150v to −150V DC output. Inverter 24 is actually three invertors 24A, 24B and 24C. Invertors 24B and 24C are turned off when the voltage on 8.1 $\mu$F Co charging capacitor 42 is 50 volts less than the command voltage and inverter 24A is turned off when the voltage on Co 42 slightly exceeds the command voltage. This procedure reduces the charge rate near the end of the charge. Step up transformers 26A, 26B and 26C are each rated at 7 kw and transform the voltage to 1200 volt AC.

Three bridge rectifier circuits 30A, 30B and 30C are shown. The HV power supply control board 21 converts a 12 bit digital command to an analog signal and compares it with a feedback signal 45 from Co voltage monitor 44. When the feedback voltage exceeds the command voltage, inverter 24A is turned off as discussed above, Q2 switch 34 closes to dissipate stored energy within the supply, Q3 isolation switch 36 opens to prevent any additional energy leaving the supply and Q1 bleed switch 38 closes to bleed down the voltage on Co 42 until the voltage on Co equals the command voltage. At that time Q1 opens.

Commutator and Compression Head

The principal components of commutator 40 and compression head 60 are shown on FIGS. 8A and 8B and are discussed above with regard to the operation of the system. In this section, we describe details of fabrication of the commutator.

Solid State Switch

In this preferred embodiment solid state switch 46 is an P/N CM 1000 HA-28H IGBT switch provided by Powerex, Inc. with offices in Youngwood, Pa.

Inductors

Inductors 48, 54 and 64 comprise saturable inductors similar to those described in U.S. Pat. Nos. 5,448,580 and 5,315,611. A top and section view of a preferred saturable inductor design is shown respectively in FIGS. 8G1 and 8G2. In the inductors of this embodiment, flux excluding metal pieces such as 301, 302, 303 and 304 are added as shown in FIG. 8G2 in order to reduce the leakage flux in the inductors. These flux excluding pieces substantially reduce current flow through the inductor prior to saturation and greatly improves the pulse forming performance of the inductor in the system. The current input to this inductor is a screw connection at 305 to a bus also connected to capacitor 62. The current makes four and one half loops through vertical conductors. From location 305 the current travels down a large diameter conductor in the center labeled 1A, up six smaller conductors on the circumference labeled 1B, down 2A, up 2B, down all of the flux excluder elements, up 3B, down 3A, up 4B and down 4A, and the current exits at location 306. Where a pot like housing 64A serves as a high voltage current lead. The "lid" 64B of the saturable inductor is comprised of an electrical insulator material such as teflon. In prior art pulse power systems, oil leakage from oil insulated electrical components has been a problem. In this preferred embodiment, oil insulated components are limited to the saturable inductors and the oil is contained in the pot-like oil containing metal housing 64A which is, as stated above, the high voltage connection output lead. All seal connections are located above the oil level to substantially eliminate the possibility of oil leakage. For example, the lowest seal in inductor 64 is shown at 308 in FIG. 8G2. Since the flux excluding metal components are in the middle of the current path through the inductor, the voltage allowing a reduction in the safe hold-off spacing between the flux exclusion metal parts and the metal rods of the other turns. Fins 307 are provided to increase heat removal.

Capacitors

Capacitor banks 42, 52 and 62 are all comprised of banks of commercially available off-the-shelf capacitors connected in parallel. These capacitors are available from suppliers such as Murata with offices in Smyrna, Ga. Applicants preferred method of connecting the capacitors and inductors is to bolt them to positive and negative terminals on special printed circuit board having heavy nickel coated copper leads in a manner similar to that described in U.S. Pat. No. 5,448,580.

Pulse Transformer

Figure 8D:
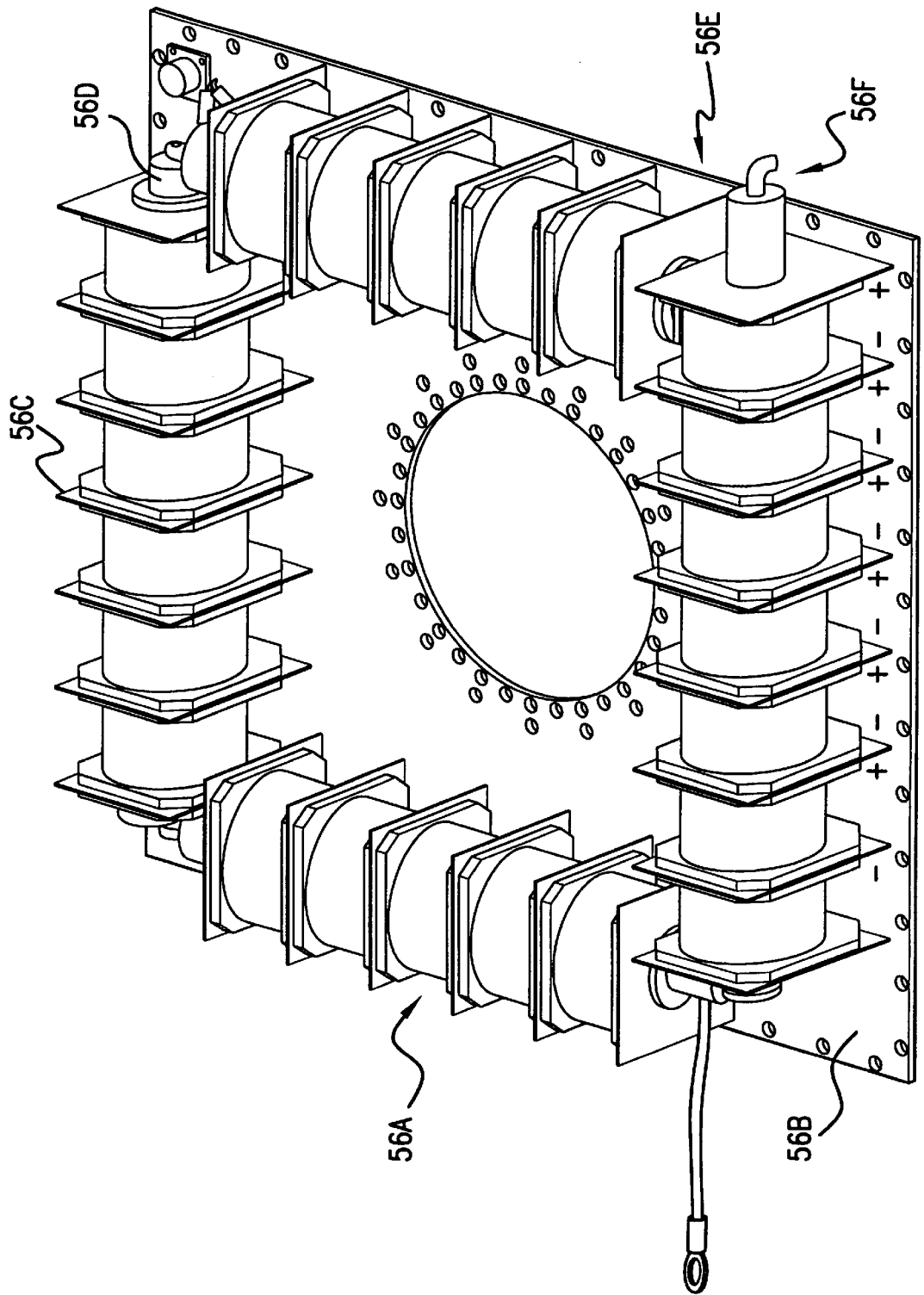
FIG. 8D is a prospective assembly drawing of a pulse transformer used in the above preferred embodiment.
Figure 8E:
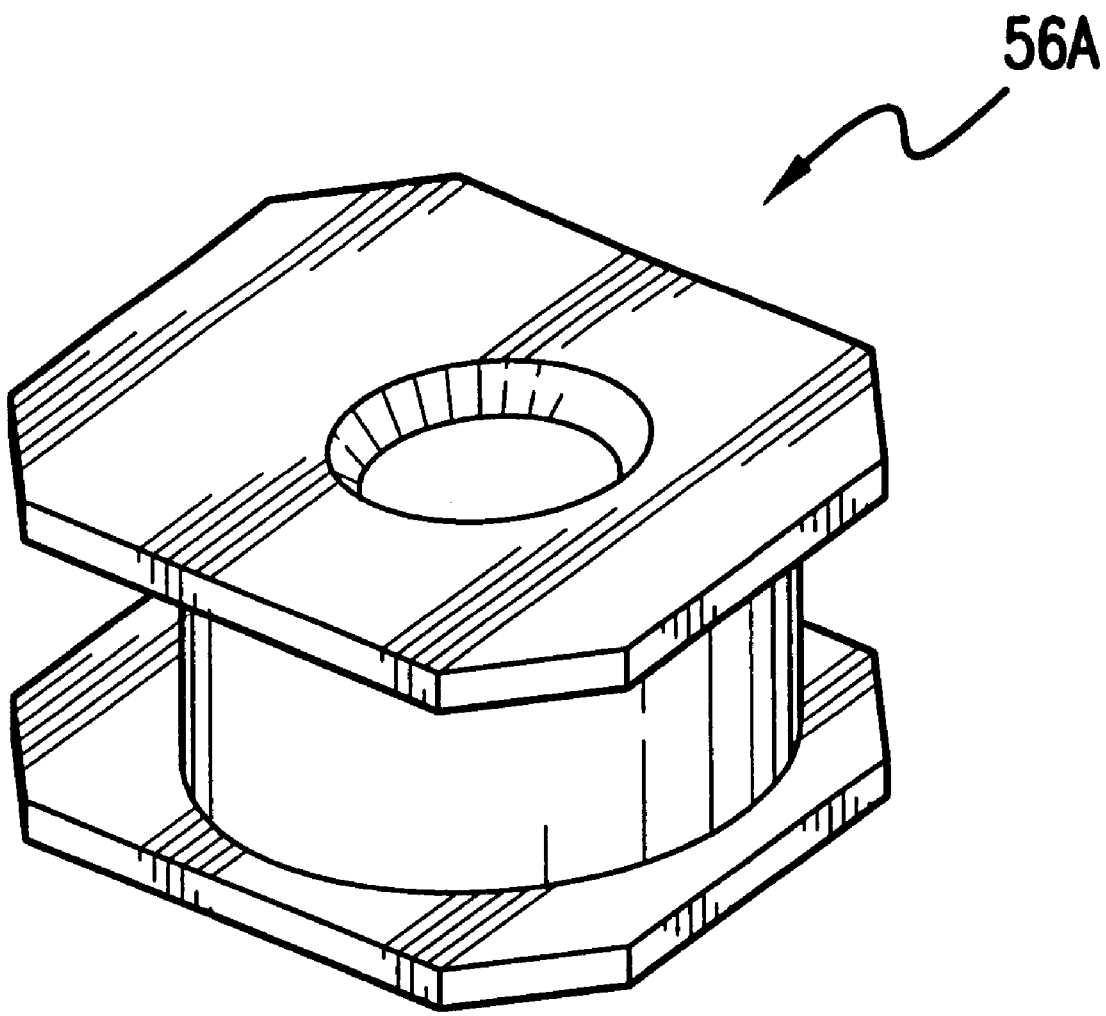
FIG. 8E is a drawing of a primary winding of a pulse transformer used in the above preferred embodiment.

Pulse transformer 56 is also similar to the pulse transformer described in U.S. Pat. Nos. 5,448,580 and 5,313,481; however, the pulse transformers of the present embodiment has only a single turn in the secondary winding and 23 primary windings. A drawing of pulse transformer 56 is shown in FIG. 8D. Each of the 23 primary windings comprise an aluminum spool 56A having two flanges (each with a flat edge with threaded bolt holes) which are bolted to positive and negative terminals on printed circuit board 56B as shown along the bottom edge of FIG. 8D. Insulators 56C separates the positive terminal of each spool from the negative terminal of the adjacent spool. Between the flanges of the spool is a hollow cylinder 1¹⁄₁₆ inches long with a 0.875 OD with a wall thickness of about ¹⁄₃₂ inch. The spool is wrapped with one inch wide, 0.7 mil thick Metglas™ 2605 S3A and a 0.1 mil thick mylar film until the OD of the insulated Metglas™ wrapping is 2.24 inches. A prospective view of a single wrapped spool forming one primary winding is shown in FIG. 8E.

The secondary of the transformer is a single stainless steel rod mounted within a tight fitting insulating tube of electrical glass. The winding is in four sections as shown in FIG. 8D. The stainless steel secondary shown as 56D in FIG. 8D is grounded to a ground lead on printed circuit board 56B at 56E and the high voltage terminal is shown at 56F. As indicated above, a 700 volt pulse between the + and − terminals of the primary windings will produce a minus 16,100 volt pulse at terminal 56F on the secondary side. This design provides very low leakage inductance permitting extremely fast output rise time.

Laser Chamber Pulse Power Components

The Cp capacitor 82 is comprised of a bank of twenty-eight 0.59 nf capacitors mounted on top of the laser chamber pressure vessel. The electrodes 83 and 84 are each solid brass bars about 28 inches long which are separated by about 0.5 to 1.0 inch. In this embodiment, the top electrode 83 is the cathode and the bottom electrode 84 is connected to ground as indicated in FIG. 8A.

Compression Head Mounting

This preferred embodiment of the present invention includes a compression head mounting technique shown in FIGS. 8H1 and 8H2. FIG. 8H1 is a side section view of the laser system showing the location of the compression head module 60 in relation to electrodes 83 and 84. This technique was designed to minimize the impedance associated with the compression lead chamber connection and at the same time facilitates quick replacement of the compression head. As shown in FIGS. 8H1 and 8H2 the ground connection is made with an approximately 28 inch long slot tab connection along the back side of the compression head as shown at 81A in FIG. 8H1 and 81B in FIG. 8H2. The bottom of the slot tab is fitted with flexible finger stock 81C. A preferred finger stock material is sold under the trade name Multilam®.

The high voltage connection is made between a six-inch diameter smooth bottom of saturable inductor 64 and a mating array of flexible finger stock at 89 in FIG. 8H1. As above, a preferred finger stock material is Multilam®. This arrangement permits the replacement of the compression head module for repair or preventative maintenance in about five minutes.

AC/DC Distribution Module

Figure 17:
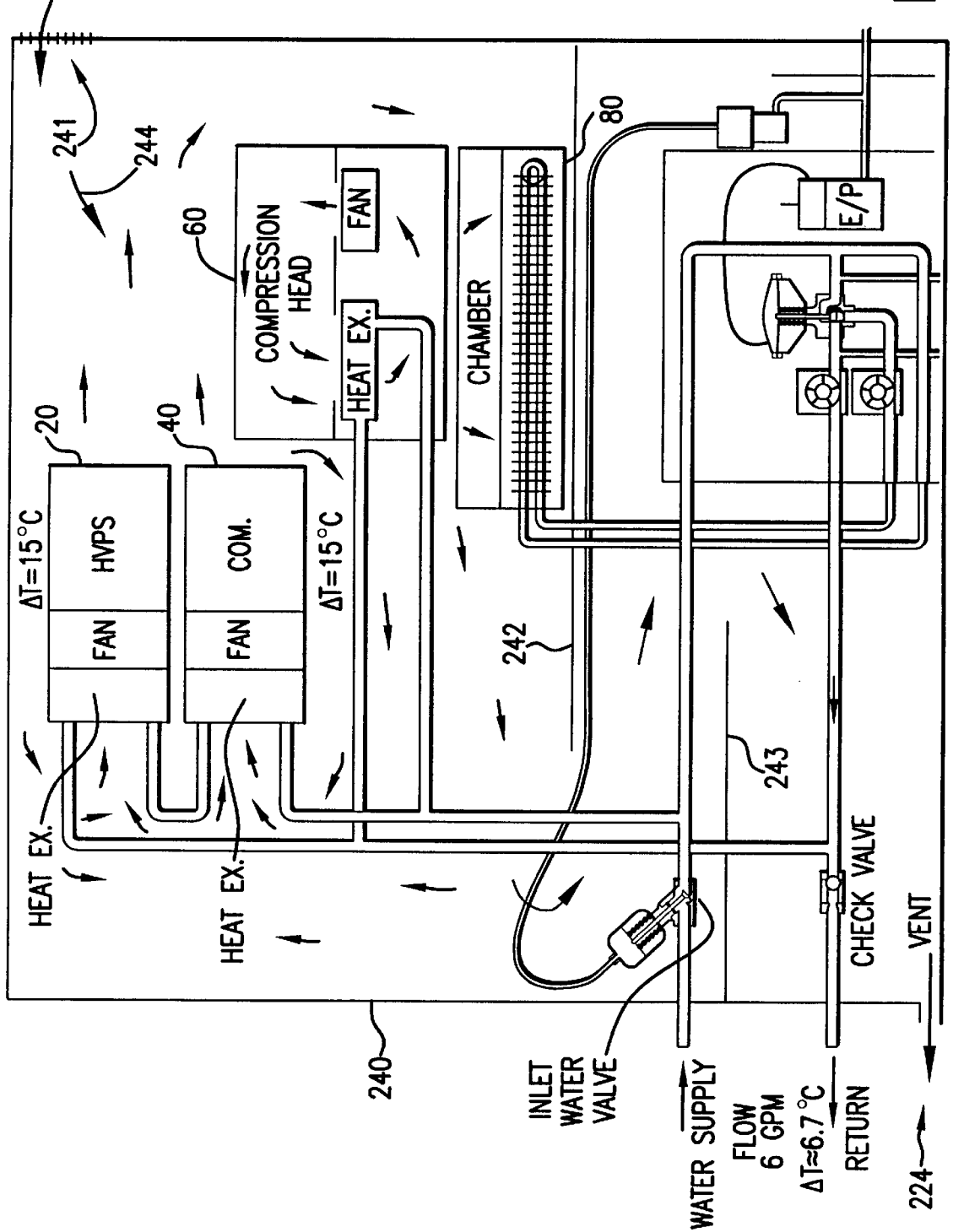
FIG. 17 describes a preferred enclosure cooling system.

In this preferred embodiment as shown in FIG. 14, substantially all of the electrical distribution breakers 600 and electrical relays 602 are contained in an AC/DC distribution module 204 (as shown in FIG. 4A) and mounted on four easily replaceable DIN rails 604A, B, C and D which can be installed or replaced in a very few minutes. The support for the DIN rails is a novel easy access, space saving staircase shaped distribution panel 606. Each of the four DIN rails are about 17 inches long and provide space for about 8 to 20 relays and/or breakers. In case of trouble shooting, maintenance or repairs, each DIN rail with all of its breakers and relays are typically replaced as a unit in about 3 minutes. All that is required is the removal of two ratchet bolts 308 with a ratchet tool and the disconnection of a ground wire (not shown). Laser service personnel will have available the fully equipped DIN rails as spare parts. In FIG. 17, DIN rail 604B is shown disconnected from distribution panel 606 and DIN rails 604A, C and D are shown connected in place. The breakers and relays connect with their respective circuits with multi-pin connectors 310 designed to handle expected currents. The pin connectors 610, ratchet bolts 608, guide rail 612, guide tab 614 all work together to assure proper alignment of the male and female pin connectors connecting the relays and breakers to their respective circuits. Spring tab 616 pops up on an outside edge of the DIN rail when the din rail is in place and all male pins of the pin connectors are fully inserted in their female counterparts.

The Applicants recognize that this improvement will necessitate the replacement of all relays and breakers on a DIN rail whenever only one of them fails. However, the cost of breakers and relays is typically 1–10 dollars; whereas the cost of downtime of a six million dollar lithography machine could be many thousands of dollars per minute.

Gas Control Module

This preferred embodiment comprises a fluorine control system which permits operation within a chosen sweet spot without the use of a fluorine monitor. This embodiment can be described by reference to FIG. 16.

Fluorine Depletion

Laser chamber 1 comprises about 20.3 liters of laser gas. Nominally as described above, the constituents are 1.3 percent krypton, 0.1 percent fluorine and the remainder neon. The 0.1 percent fluorine represents a volume of about 0.0020 liters or 2 ml of fluorine at 3 atm. In mass terms the nominal amount of fluorine in the laser chamber is about 81 mg. The partial pressure of the pure fluorine is about 280 Pa, pure fluorine (corresponding to about 28 kPa of the 1% fluorine mixture). During normal operations with the laser operating at a duty factor of about 40 percent (which is typical for a lithography laser) fluorine is depleted at a rate of about 3.3 mg per hour (this corresponds to about 4% of the fluorine in the chamber per hour). In terms of partial pressure of pure fluorine, this normal depletion rate of fluorine is about 1.45 Pa per hour. To make up for this depletion using the 1% fluorine gas mixture, a volume of the mixture equivalent to about 1.15 kPa per hour is added to the chamber.

The fluorine depletion rate for the laser is far from constant. If the laser fan is operating but no lasing is taking place the fluorine depletion rate is cut approximately in half. If the fan is shutdown the fluorine depletion rate is cut to about ¼ the 40% duty factor depletion rate. At 100% duty factor the depletion rate is about double the 40% duty factor depletion rate.

Temperature Compensation in Gas-Function Software

A preferred embodiment of the present invention comprises software which seals all gas pressure readings to a common temperature eliminates temperature effects when comparing gas functions such as bleeds or injects that occur at different times or on different systems. Gas pressures at arbitrary temperatures may also be scaled to produce the equivalent pressures at operating temperature. Temperature compensation can be added into gas-function software to produce more consistent gas pressures under operating conditions.

For a fixed number of moles of gas in a closed volume, the ratio P/T (absolute pressure over absolute temperature) is constant. If we define pressure at a reference temperature ($P_{ref}$ and $T_{ref}$, respectively) and then change the temperature, we have $$P_{ref}/T_{ref} = P/T$$

so that either $$P_{ref} = P * T_{ref}/T \quad (1)$$

or $$P = P_{ref} * T/T_{ref} \quad (2)$$

In both cases, the pressure P at temperature T corresponds to the pressure $P_{ref}$ at temperature $T_{ref}$. Equation (1) scales a pressure reading back to the reference temperature $T_{ref}$, for example in comparison of pressures recorded at different temperatures. Equation (2) scales a desired pressure at $T_{ref}$ to the equivalent pressure at the current temperature T, which would be used in setting pressure targets for gas functions. For example, assume the desired pressure from a gas fill is 290 kPa at 50° C. (323.2° K.), and the chamber temperature is 27° C. (300.2° K.). Equation (2) yields a corrected target pressure of P=(290 kPa)(300.2)/(323.2)= 269 kPa. If the chamber is filled to this initial pressure at 27° C., the pressure at a temperature of 50° C. will be 290 kPa, as desired.

Discharge Voltage vs. Fluorine Concentration for Constant Pulse Energy "Sweet Spot"

For typical KrF lasers including this preferred embodiment, the discharge voltage needed to maintain a desired pulse energy is a monotonically decreasing function of fluorine concentration within the desired operating range of the laser. The prior art has demonstrated that fairly large swings of discharge voltage and fluorine concentration are possible while keeping the pulse energy output substantially constant. However, wide swings of the discharge voltage and fluorine concentration can result in variations in important laser beam parameters such as wavelength, bandwidth, energy sigma (a measure of the small pulse to pulse energy variations) pulse time profile and spatial profile. Generally there will be an optimum operating range (i.e., a "sweet spot") on the discharge voltage—fluorine concentration (at constant energy) graph at which the above beam parameters are optimized. Such "sweet spot" may be chosen based by the laser operator making trade-off decisions regarding which of the beam parameters are more important while keeping all beam parameters within desired specification ranges. A process for determining the "sweet spot" is described in U.S. patent application Ser. No. 08/915,030 which is incorporated herein by reference.

This process is summarized as follows:

1. Fill the laser with a quantity of fluorine such that the desired pulse energy will be produced with a charging voltage near the upper limit of the charging voltage range.
2. Measure charging voltage (or use control voltage as an excellent estimate of the actual charging voltage), line width and energy sigma.
3. Bleed laser gas (which is about 0.09% fluorine) until the chamber pressure decreases 2 kPa. Increase the fluorine concentration by adding sufficient at 1% fluorine to increase the chamber pressure 2 kPa.
4. Repeat step 2.
5. Repeat steps 3 and 4 until the discharge voltage is near its bottom limit.
6. Plot the data and select the fluorine concentration sweet spot.

Table I shows a typical set of data from a prior art laser and a sweet spot of 28.5 kPa (representing 1% $F_2$) about 285 Pa (pure fluorine) is chosen.

TABLE I

| Number of Injects | Cumulative F2 pressure (kPa) | Average Voltage (Volts) | Linewidth (pm) | Energy Sigma (%) |
|---|---|---|---|---|
| 0 | 18.5 | 790 | 0.44 | 2.5 |
| 1 | 20.5 | 690 | 0.44 | 1.9 |
| 2 | 22.5 | 632 | 0.45 | 1.6 |
| 3 | 24.5 | 618 | 0.46 | 1.5 |
| 4 | 26.5 | 598 | 0.47 | 1.7 |
| 5 | 28.5 | 584 | 0.49 | 1.7 |
| 6 | 30.5 | 575 | 0.49 | 1.7 |

TABLE I-continued

| Number of Injects | Cumulative F2 pressure (kPa) | Average Voltage (Volts) | Linewidth (pm) | Energy Sigma (%) |
|---|---|---|---|---|
| 7 | 32.5 | 571 | 0.5 | 1.8 |
| 8 | 34.5 | 568 | 0.51 | 1.8 |
| 9 | 36.5 | 567 | 0.52 | 1.8 |

Operating within Fluorine "Sweet Spot" Without Fluorine Monitor

Once the sweet spot is determined, operation within it could be accomplished by:
(1) monitoring the pulse energy and providing a feedback mechanism to very rapidly and automatically adjust the discharge voltage as necessary to keep the pulse energy within a desired very narrow range and
(2) then monitoring the discharge voltage (or control voltage) and injecting fluorine as necessary to keep the discharge voltage within a desired sweet spot corresponding to a desired fluorine concentration as determined by the curve of charging voltage vs. fluorine concentration.

One method to attempt to operate within the "sweet spot" would be to inject fluorine continuously at the same rate as it is being depleted. A feedback loop based on discharge voltage would control the fluorine flow. Such a system requires precision flow control valves and complicated control systems. A simpler method for staying within the sweet spot is shown by reference to FIG. 16. This system provides automatic control and is designed for precisely controlled periodic fluorine injections at intervals as low as about 3 to 5 minutes.

As indicated above, for a typical modem high pulse rate 10 mJ lithography KrF excimer laser, a the fluorine depletion rate for operation at a load factor of 40% would be about 3.3 mg per hour or 55 micrograms per minute. This decrease in the fluorine concentration would require an increase in the charging voltage of 12 volts per hour or about 6 volt for each 30 minutes (assuming no fluorine is added). For example, a voltage increase from about 602 volts to about 608 volts during a thirty minute period would be typical. Thus, if the sweet spot corresponds to a 605 volt charging voltage at a pulse energy of 10 mJ, the system in FIG. 5 is programmed to adjust the charging voltage as necessary to control the pulse energy to 10 mJ per pulse until the voltage increases to 608 volts as the result of fluorine depletion. At this point about 1.65 milligrams of fluorine is injected which improves the efficiency of the laser so that the pulse energy discharge voltage feedback circuit automatically causes the voltage to decrease to about 602 volts, then as further depletion of fluorine occurs the voltage will gradually increase to 608 volts again at which time another injection will be called for. The ΔV width of this sweet spot would be about 6 volts or about 1.0 percent of the nominal voltage, a very great improvement over prior art techniques where the voltage swings are about 8 percent. The reader should note that voltage monitors and controls for individual signals are accurate to about 0.1%, but control can be made much more precise than this by averaging about 10,000 signals for use as a feedback value to control fluorine injection. Obviously, a smaller ΔV limit could be used such as 604 volts and 606 in which case the injection interval could be about 10 minutes and a one volt ΔV would result five minute injection intervals.

Normal Automatic Operations Procedure

Figure 16:
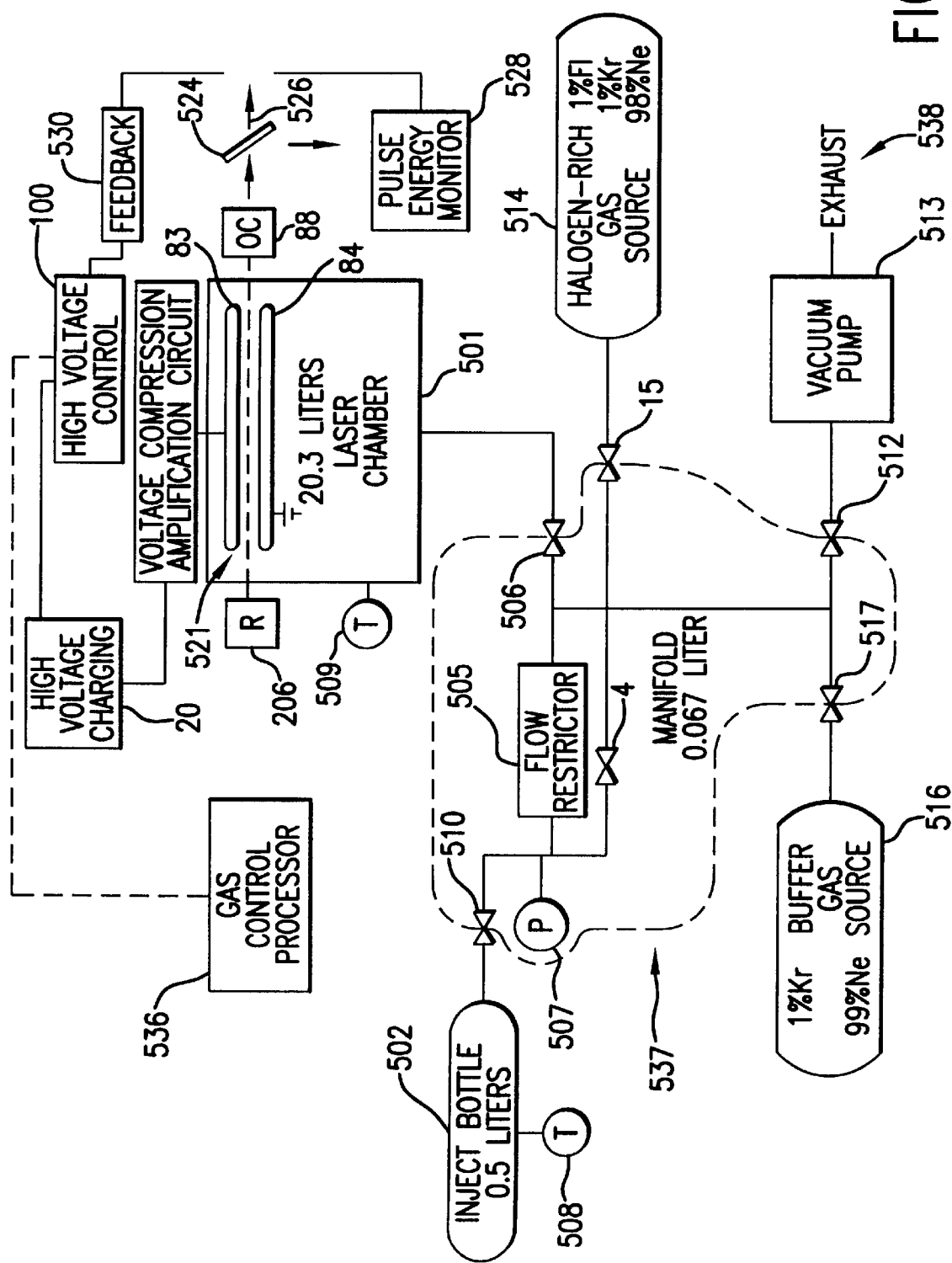
FIG. 16 shows a big manifold gas supply system.

By reference to FIG. 16, this process is accomplished as follows. Laser chamber is filled to about 3 atmospheres (290 kPa) with the lasing gas mixture discussed above (i.e., 0.1% Fl, 1.3% Kr and 98.5% Ne). This produces lasing in an optically-resonant cavity consisting of reflecting element 20 and output coupler 22 as a result of periodic discharges between electrodes 21. Laser beam 26 exits the laser through output coupler 88, and a small portion of the beam is extracted with beam splitter 524 and directed to pulse energy monitor 528 which is a fast photodiode. A feedback signal is sent through circuit 530 to high voltage control processor 100 which regulates the high voltage charging system 20 which provides a controlled high voltage input in the range of about 600 volts to about 1100 volts (depending primarily on the fluorine concentration, the time since the last refill and the age of the laser components) to voltage compression and amplification circuit 40–60 which compresses and amplifies the high voltage from high voltage charging system 20 to very short discharge pulses in the range of about 11,000 volts to 20,000 volts across electrodes 83 and 84.

The magnitude of the discharge voltage pulse needed to produce a desired pulse energy such as 10 mJ depends substantially on the fluorine concentration and for this type of laser. The operating voltage range should preferably be determined by the performance of a test (discussed above) in which the fluorine concentration is allowed to vary over the possible operating range with a corresponding variation in the discharge voltage and pulse parameters measured to determine the "sweet spot" for the particular laser. Once the sweet spot has been determined (for example, 602 volts to 608 volts) the laser can be controlled automatically within the sweet spot using the system described in FIG. 16.

Sufficient fluorine is injected into the chamber to permit the laser to produce the desired pulse energy with a charging voltage lower than the upper limit of the sweet spot voltage. With valves 510, 506, 504, 515, 517 and 512 closed, the laser is operated with the high voltage control 100 controlling the charging voltage to produce the desired pulse energy until fluorine depletion causes the charging voltage to increase to the upper limit of the sweet spot voltage, in this case 608 volts. Gas control processor 536 monitors the high voltage values utilized by high voltage control 100 and when 608 volts is reached, processor 536 opens valve 506 then reads the chamber pressure from a pressure transducer 507 after its signal stabilizes. (In this embodiment, an average of 10,000 control voltage values are averaged to establish the discharge voltage. At 2,000 Hz this takes 5 seconds.) Stabilization of the pressure requires about 10 seconds. If the chamber pressure is higher than the pre-inject target pressure (e.g., 290 kPa), gas control processor 536 using a predetermined value of ΔP/ΔT will calculate the time necessary then the processor will cause valve 512 to open for time necessary to reduce the chamber pressure to 290 kPa then it closes valve 512. Valve 512 may be blipped in little steps. Processor 536 waits 10 seconds for the pressure to stabilize and reads the chamber pressure again from a signal from transducer 507. The process may be repeated but if it is the laser operator is informed to check the predetermined ΔP/ΔT timing value for valve 512. Also the processor can be programmed to update values of ΔP/ΔT based on measurements during bleed periods.

After the preinject chamber pressure is determined to be about 290 kPa or less. Valve 506 is closed and valves 515, 510 and 504 are opened and inject bottle 502 is pressurized to $$\Delta kPa \approx \frac{(\text{INJECT SIZE})(\text{CHAMBER VOLUME})}{(\text{INJECT BOTTLE})(\text{PLUS MANIFOLD VOLUME})}$$

in excess of the chamber pressure with halogen rich gas from gas bottle 514. This gas bottle 14 contains a mixture of 1% Fl, 1% Kr and 98% Ne. Valves 515 and 504 are then closed and valve 506 is opened permitting gas from inject bottle 502 and manifold 537 to flow into laser chamber 1. The volume of gas in bottle 502 and manifold 537 is 0.567 liters and the gas will flow until the pressure is equalized in the chamber, manifold and inject bottle. Assuming an initial chamber pressure of 290 kPa, the new pressure (neglecting possible temperature effects) will be about:

$$P = \frac{20.3l}{20.867l}(290 kPa) + \frac{0.567l}{20.867l}(310 kPa)$$

P=290.54

The increase in pressure is 0.54 kPa which implies that about $$\left(\frac{.54 kPa}{290 kPa}\right)(20.3l) = 37 \text{ ml}$$

of the halogen rich gas mixture (at about 290 kPa) was added to the chamber.

Since the halogen rich gas source is only 1% fluorine, the actual volume of fluorine added is only about 0.37 ml (again at the chamber pressure of 290 kPa). A volume of 0.37 ml of fluorine at 290 kPa represents a mass of fluorine of 1.5 mg. Since in this example, the normal depletion rate of fluorine is in the range of about 3.3 mg/hr. this addition of fluorine would be sufficient to compensate for depletion for a period of 27 minutes so that to maintain substantially constant fluorine concentration with injections of this magnitude, injection would occur at intervals in the range of about 27 minutes. Processor 536 is programmed to begin the injections each time the high voltage control voltage (which preferably is averaged over about 10,000 pulses) reaches the upper limit of the sweet spot voltage range when the laser is operating.

The system may include flow restrictor 505, which preferably includes a needle valve, which can be manually adjusted to control the rate of flow from inject bottle 502 into chamber 1. If desired, it is adjusted to spread out the flow over about 70 to 90% of the interval between injections. By so doing this procedure approaches a continuous injection system but is much simpler. Alternatively flow restrictor 505 could be a computer controlled needle valve with which continuous injection could be even more closely approximated.

Gas Replacement

The process described above basically replaces depleted fluorine on an almost continuous basis. Since the fluorine gas source is only 1% fluorine it also replaces a portion of the Kr and Ne in the chamber on an almost continuous basis. Nevertheless, even though a portion of the laser gas is being substantially continuously replaced, operation in this mode results in a build up of contaminants in the laser gas which reduces the efficiency of the laser. This reduction in efficiency requires an increase in the voltage and/or an increase in the fluorine concentration to maintain the desired pulse energy. For this reason, normal practice with prior art systems suggest that periodically the laser be shutdown for a substantially complete gas exchange. This substantially complete gas exchange is referred to as a refill. These periods may be determined based on number of laser pulses such as 100,000,000 pulses between refills, or refill times may be determined based on calendar time since the last refill or a combination of pulses and calendar time. Also the refill times may be determined by the magnitude of the charging voltage needed for a desired output at a particular fluorine concentration. Preferably after a refill a new test for the "sweet spot" should be run. Also, periodically in between fills the sweet spot test should be performed so that if the sweet spot changes the operator will know where the new sweet spot is.

A refill may be accomplished using the system shown in FIG. 16 as follows. With valves 510, 506, 515, 512, 517, and 504 closed, valves 506 and 512 are opened, vacuum pump 513 is operated and the laser chamber is pumped down to an absolute pressure of less than 13 kPa. (A direct pump down line may be provided between the chamber 1 and vacuum pump 513 to permit a quick pump down.) Valve 512 is closed. Valve 516 is opened and 1% Kr, 99% Ne buffer gas from buffer gas bottle 516 is added to the chamber to fill it to a pressure equivalent to 262 kPa at 50° C. (Note that for this 20.3 liter laser chamber, temperature correction can be approximated using a $\Delta P/\Delta T$ correction of 1 kPa/° C. for a chamber temperature deviation from 50° C. So if the chamber temperature is 23° C. it would be filled to 247 kPa.) Valve 517 is closed and valve 515 is opened and a quantity of the 1% Fl, 1% Kr, 98% Ne mixture from halogen rich gas bottle 514 is added to chamber 1 to fill it to a pressure equivalent to 290 kPa at 50° C. (Note the same temperature correction discussed above can be used.) This will produce a gas mixture in the chamber of approximately 0.1% Fl, 1.0% Kr and 98.9% Ne. When the chamber is heated to about 50° C. the pressure will be about 3 atm or 290 kPa.

Pulse Width Used To Control Fluorine Injections

In a preferred embodiment, a fast photo detector (such as a photo-diode) can be utilized to measure periodically (such as for each pulse or once per second) the temporal pulse shape to determine pulse width or the integral square pulse width (i.e., $[\int f(t)dt]^2/\int f^2(t) dt$ where f(t) is the temporal pulse wave form). Many measurements can be averaged to improve accuracy. Applicants have discovered that at constant pulse energy the pulse width and especially the integral square pulse width is a strong function of fluorine concentration. Therefore, measurements of pulse width or the integral square pulse width can be used in a feedback scheme to regulate fluorine injections on a continuous or semi-continuous basis to maintain fluorine concentration within a desired range or "sweet spot". The photo detector shown at 196 in FIG. 10 can be used to monitor pulse width. In addition to serving as a wavelength calibration detector. Or a separate detector could be provided.

N₂ PURGE SYSTEM

Because ozone ($O_3$) created from oxygen ($O_2$) in the presence of high energy UV photons can be extremely detrimental to optical components oxygen should be substantially eliminated from optical subsystems. Applicants have developed an $N_2$ purge system that is greatly improved over prior art systems. All optical components associated with the laser that are outside the chamber are purged with nitrogen. This nitrogen system is operated at a pressure that is during operation of the laser only about 10 pascals in excess of atmospheric pressure. This small pressure differential is preferred to avoid a pressure distortion effect on the optical components. Components purged include the line narrowing module, the output coupler, the wavemeter and the shutter assembly.

Seals are provided at all potential leakage sites, and output ports are connected by 1/16-inch i.d. tubes about 6 feet long to flow rate detection devices. The flow through the output ports is monitored to assure proper functioning of the purge system. Preferred flow rates of about 1 liter through the 1/16-inch id. 6-foot long tube correspond to the desired $N_2$ pressure differential.

RESONANCE CAVITY

Etalon Output Coupler

Figure 15A:
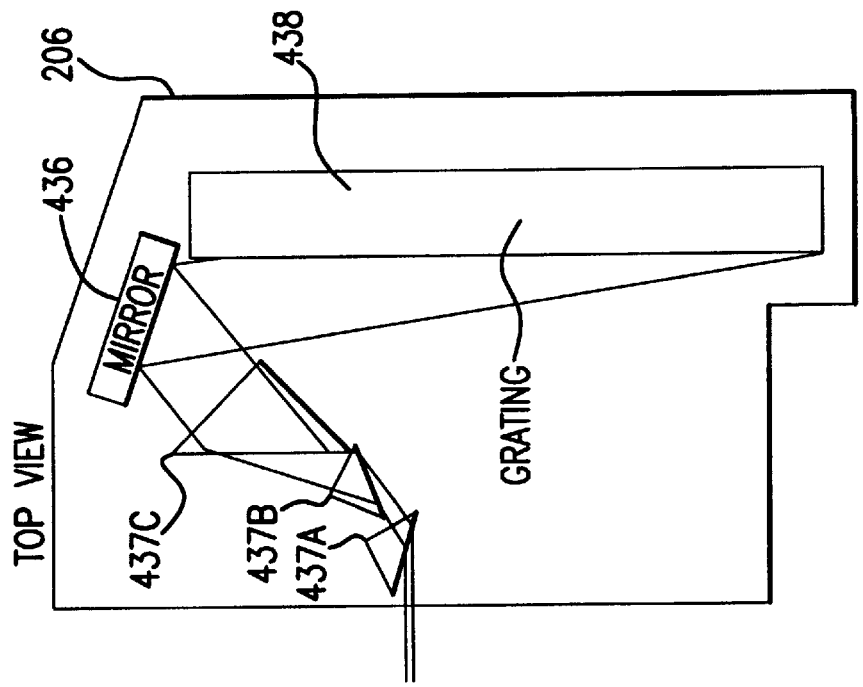
FIG. 15A is a sketch of a resonance cavity.
Figure 15A:
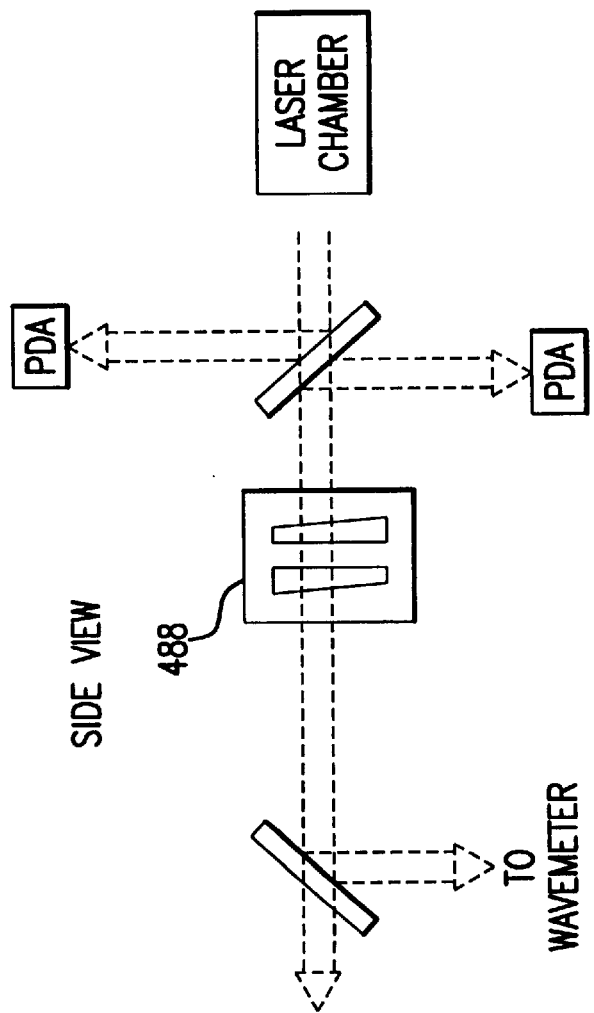
Figure 15B:
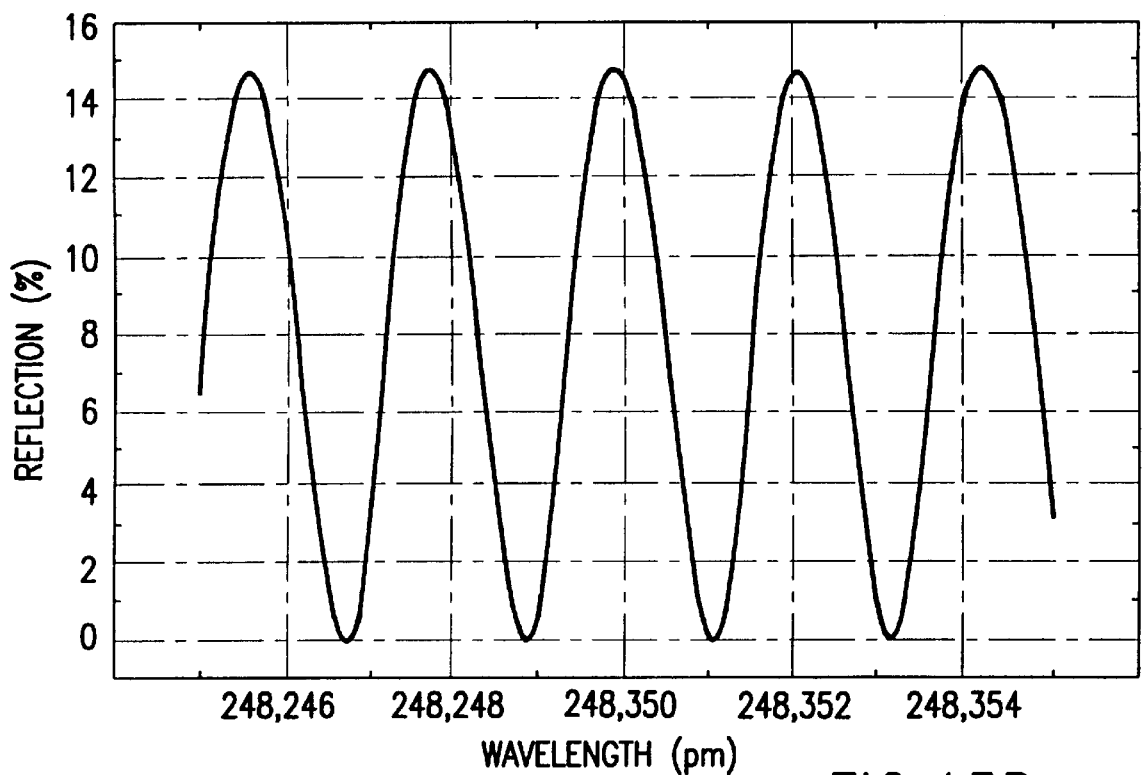
FIG. 15B shows reflection versus wavelength for an etalon.
Figure 15C:
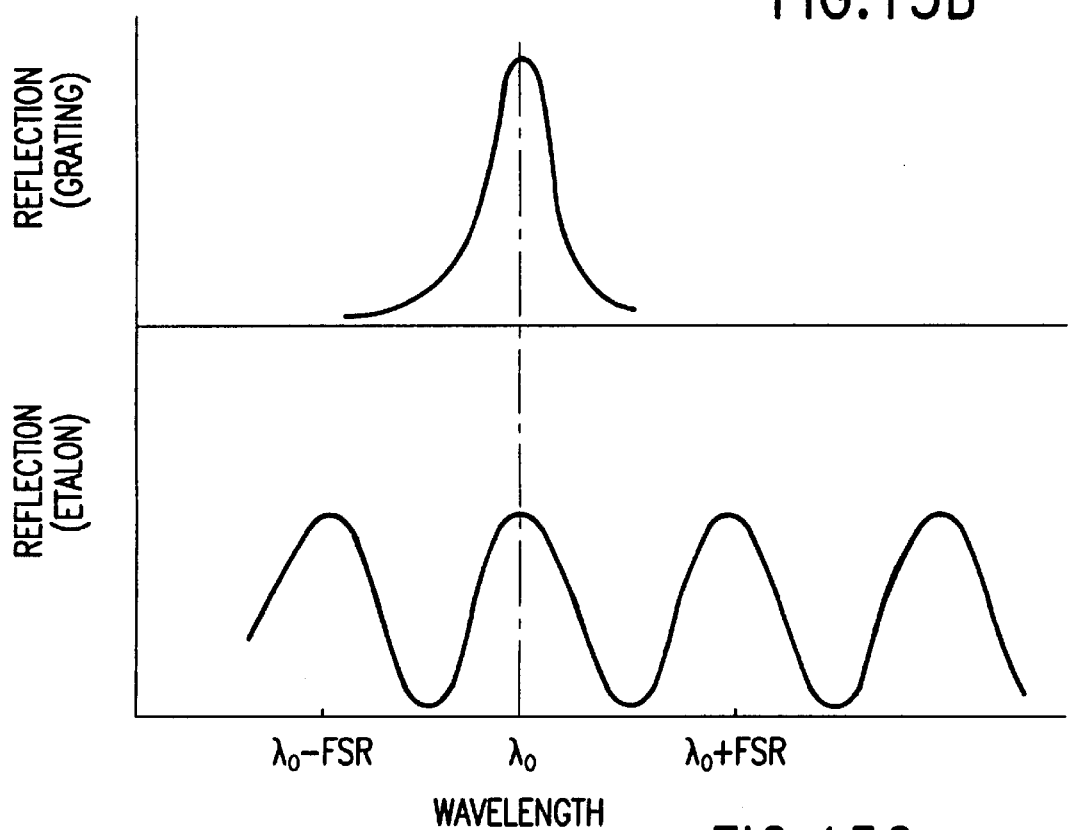
FIG. 15C shows how to match a grating with an etalon.

A preferred embodiment of the present invention comprises an etalon output coupler as shown at 488 in FIG. 15A which has a reflectivity of the plates of about 4%. The etalon is gas filled with nitrogen with an regtactive index of 1.0003. The gap size is about 15 mm and the wavelength is about 248 nm. In this case, the total reflectivity of the etalon is determine by an interference of the light waves, reflected from both parallel surfaces and is shown in FIG. 15B as a function of wavelength. The minimum reflection is about 0% and the maximum is about 15%. If one of the reflection peaks is matched to the grating maximum, then about 15% of the light at the grating maximum is reflected (85% is transmitted). Portions of the beam which are higher or lower in wavelength than the grating maximum by about 1 pm are not reflected at all. Light which deviates from the grating maximum by about 2 pm would be reflected at about 15%. However, the grating is effective in controlling about 95% of the light to within about 1.5 pm of the grating maximum. Therefore, for the best line-narrowing, one of the maximums of the etalon reflection should be at the same wavelength as the maximum reflection of the grating 438 in line narrowing module 206 as shown in FIG. 15C. In this case, the laser will generate at the central wavelength $\lambda_0$, and it will have the minimum line-width as wavelength selection effects of the etalon adds to the wavelength selection effects of the grating. When the laser wavelength needs to be changed, the mirror 436 as shown in FIG. 15A is tuned at the different angle, thus moving the maximum of diffraction grating reflection to a different $\lambda^{0'}$. The etalon output coupler then needs to be tuned also, so that the new center wavelength $\lambda_0'$ coincides with one of the etalon maximums.

The reader should understand that this etalon is considerably different from the more conventional "transmissive" etalon. In the latter case, the reflectivity of the parallel plates is chosen between 20% and 99% of the light (as compared to 4% for the transmissive etalon), and the line-narrowing is done for the transmitted light through the etalon. The multiple reflections (about 5 to 50) of the light between the parallel plates greatly increases the light intensity inside the etalon, thus causing a number of serious problems when high power laser operation is required. Such problems include, for example, thermal distortions of the beam and failure of the reflective coatings. All these problems are insignificant in the etalon output coupler of the present invention because there is no multiple reflection of the light between the parallel plates. Instead, essentially single reflection from one plate interferes with a single reflection from the other plate. Some double reflections occur but with a very low probability and triple reflections are very insignificant.

Line Narrowing Module Improved Gratings

Figure 15E:
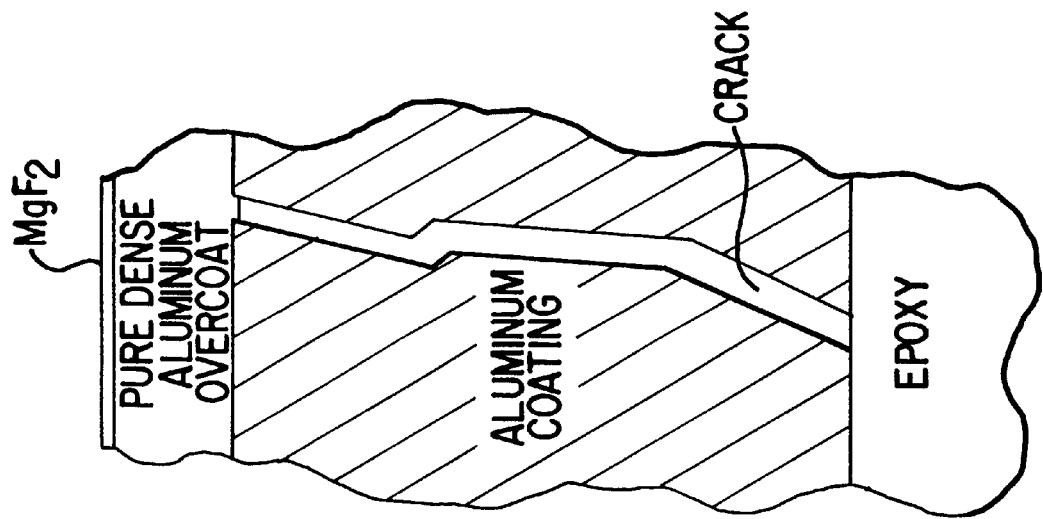
FIGS. 15D and 15E show grating cross section.
Figure 15D:
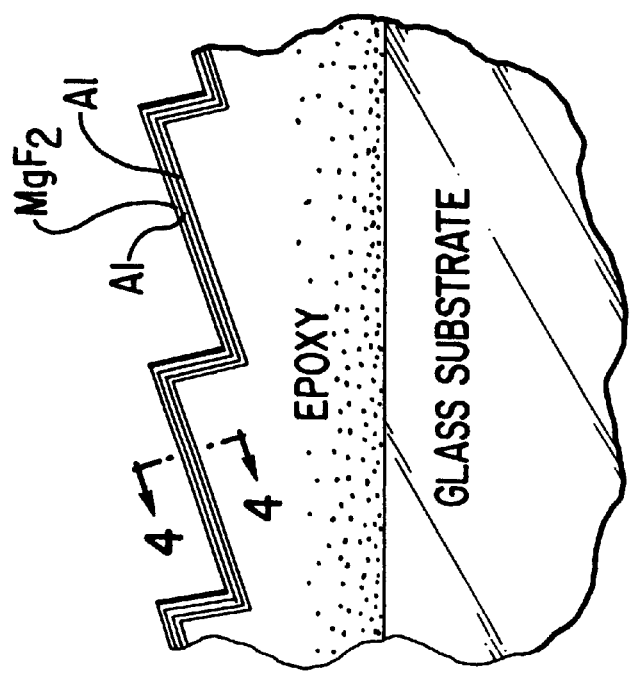

Applicants have developed a grating highly resistant to photon damage. A preferred method for fabricating this grating is described in detail in U.S. patent application Ser. No. 08/939,611, filed Sep. 29, 1997, which is incorporated herein by reference. The first steps in the fabrication of the gratings are similar to the well-known technique of making replica gratings from master or submaster gratings. This technique produces a grating having an epoxy substrate with a thin aluminum reflective coating, which may be cracked or has relatively thick grain boundaries containing oxides and hydroxides of aluminum and typically is also naturally coated with an aluminum oxide film. The grating is subsequently recoated in a vacuum chamber with a thin, pure, dense aluminum overcoat and then also in the vacuum the aluminum overcoat is coated with a thin film of $MgF_2$. The grating is especially suited for use for wavelength selection in an ArF laser operating producing an ultraviolet laser beam at a wavelength of about 193 nm. The oxygen free aluminum overcoat prevents the ultraviolet light from causing damage by stimulating chemical reactions in grating materials under the aluminum grating surface or in the aluminum oxide film. The MgF2 additionally prevents oxidation on the surface of the aluminum overcoat. A cross-sectional views of the grating are shown in FIGS. 15D and 15E.

Calcium Fluoride Beam Expanding Prisms

The increase in the repetition rate had the effect of substantially increasing the light passing through the line-narrowing module. The additional heat generated by absorption of this additional illumination causes thermal distortion in prior art beam expanding fused silica prisms. To solve this problem prior art fused silica prisms were replaced with calcium fluoride prisms. The three beam expanding CaF prisms 437A, B and C are shown in FIG. 15A. Calcium fluoride has higher thermal conductivity and can handle the additional energy without unacceptable distortion.

Thermal lensing in CaF prisms is substantially lower than that for fused silica for two reasons. CaF prisms have thermal conductivity about 10 times that of fused silica and absorption at UV wavelength about one half that of fused silica. The advantages of CaF over fused silica have for some time been recognized by stepper makers but Applicants were to the best of their knowledge the first to apply the new high quality CaF technology to and the production use of CaF prism beam expanders.

Prism 437A is a 1-inch prism mounted with an angle of incidence of 74.2 degrees, prism 437B is a 1-inch prism mounted at 75.26 degrees, and prism 437C is a two inch prism mounted at 75.87 degrees. The magnification of the beam expansion system system is 25.1 and the dispersion of the line narrowing system is 1.01 mr/pm. This represents a 23 percent increase in magnification and dispersion over prior art designs. In a preferred embodiment the slit width of 435 has been reduced to 15 mm from prior art slits of 17 mm. These improvements have resulted in substantial improvements in pulse band width especially in the 95 percent integral band width. At moderate to higher fluorine concentrations these improvements are in the range of about 0.3 pm.

IMPROVED WAVEMETER

The present invention provides a major improvement in the wavelength quality in the precision of the nominal wavelength value, the stability of the wavelength, and the bandwidth. These improvements in beam quality have resulted in the need for a better wavemeter. Thus, a better wavemeter is included in this embodiment of the present invention. The wavemeter can he described by reference to FIG. 10.

Figure 10:
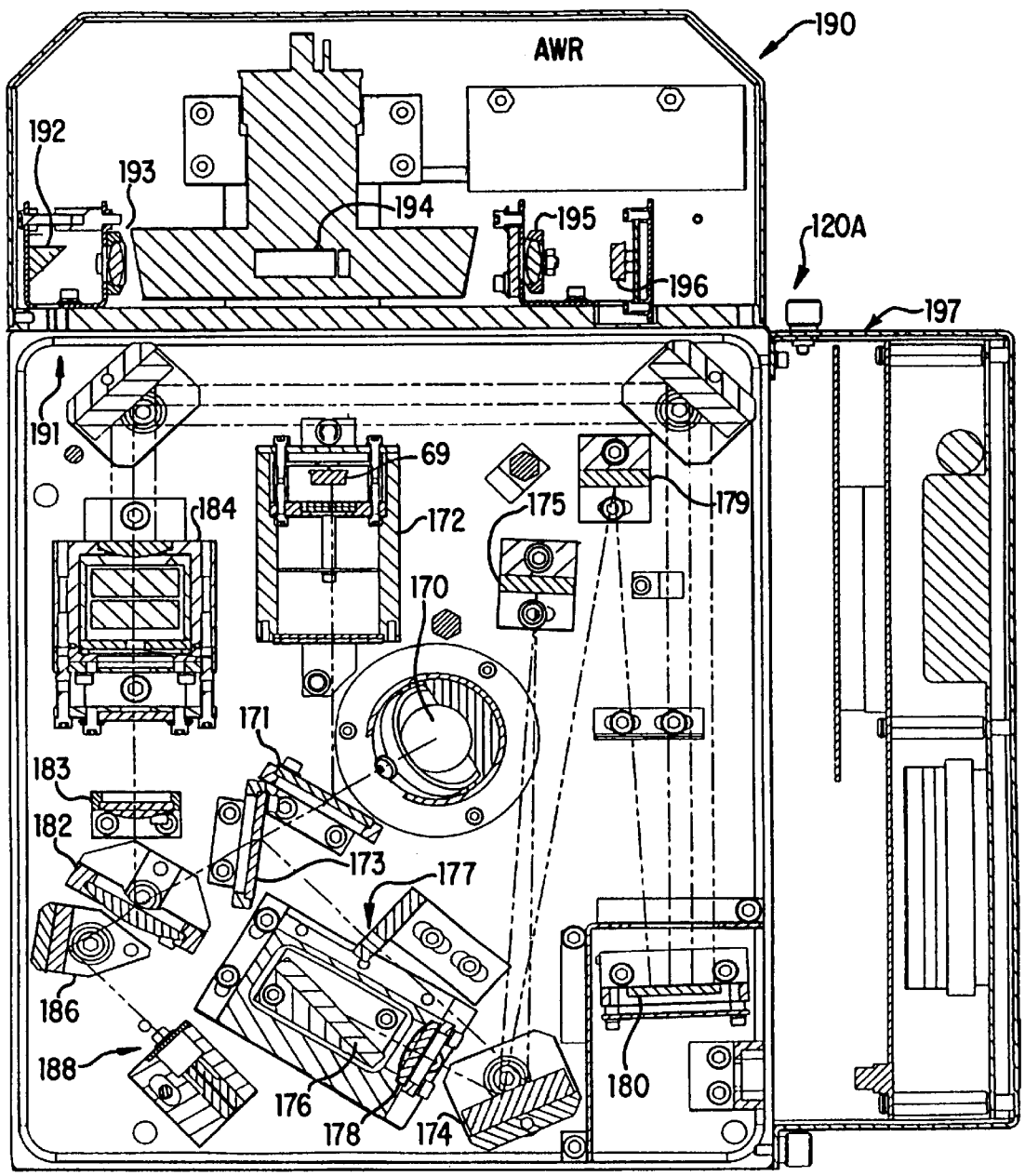
FIG. 10 is a drawing showing features of an improved wavemeter.

As shown in FIG. 10, the output beam from the laser chamber intersects partially reflecting mirror 170, which passes about 95.5% of the beam energy and reflects about 4.5%.

About 4% of the reflected beam is reflected by mirror 171 to energy detector 172 which comprises a very fast photo diode 92 which is able to measure the energy of individual pulses occurring at the rate of 2000 per second. The pulse energy is about 10 mJ and the output of detector 69 is fed to computer controller 102 (FIG. 8A) which uses a special algorithm (described below) to adjust the laser charging voltage to precisely control the pulse energy of future pulses based on stored pulse energy data in order to limit the variation of the energy of individual pulses and the integrated energy of bursts of pulses, all as described hereinafter.

About 4% of the beam which passes through mirror 171 is reflected by mirror 173 through slit 177 to mirror 174, to mirror 175, back to mirror 174 and onto eschelle grating 176. The beam is collimated by lens 178 having a focal length of 458.4 mm. Light reflected from grating 176 passes back through lens 178, is reflected again from mirrors 174, 175 and 174 again and then is reflected from mirror 179 and focused onto the left side of linear photo diode array 180. The position of the beam on the photo diode array is a coarse measure of the relative nominal wavelength of the output beam. About 90% of the beam which passes through mirror 173 is reflected off mirror 182 through lens 183 into etalon 184 the beam exiting etalon 184 is focused by a 458.4 mm focal length lens in the etalon and produces interference fringes on the middle and right side of linear photo diode array 180 after being reflected off two mirrors as shown in FIG. 10.

The spectrometer must measure wavelength and bandwidth substantially in real time. Because the laser repetition rate may be 2 $kH_z$ or higher, it is necessary to use algorithms which are accurate but not computation intensive in order to achieve the desired performance with economical and compact processing electronics. This amounts to using integer as opposed to floating point math, and operations are all linear (or use of square root, sine, log, etc.).

Figure 11A:
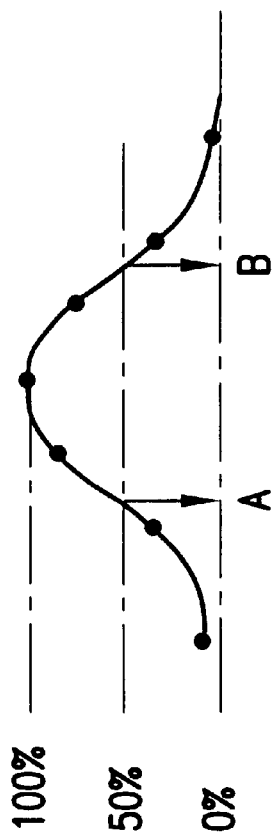
FIGS. 11A and 11B are graphs describing the functioning of the FIG. 10 wavemeter.
Figure 11B:
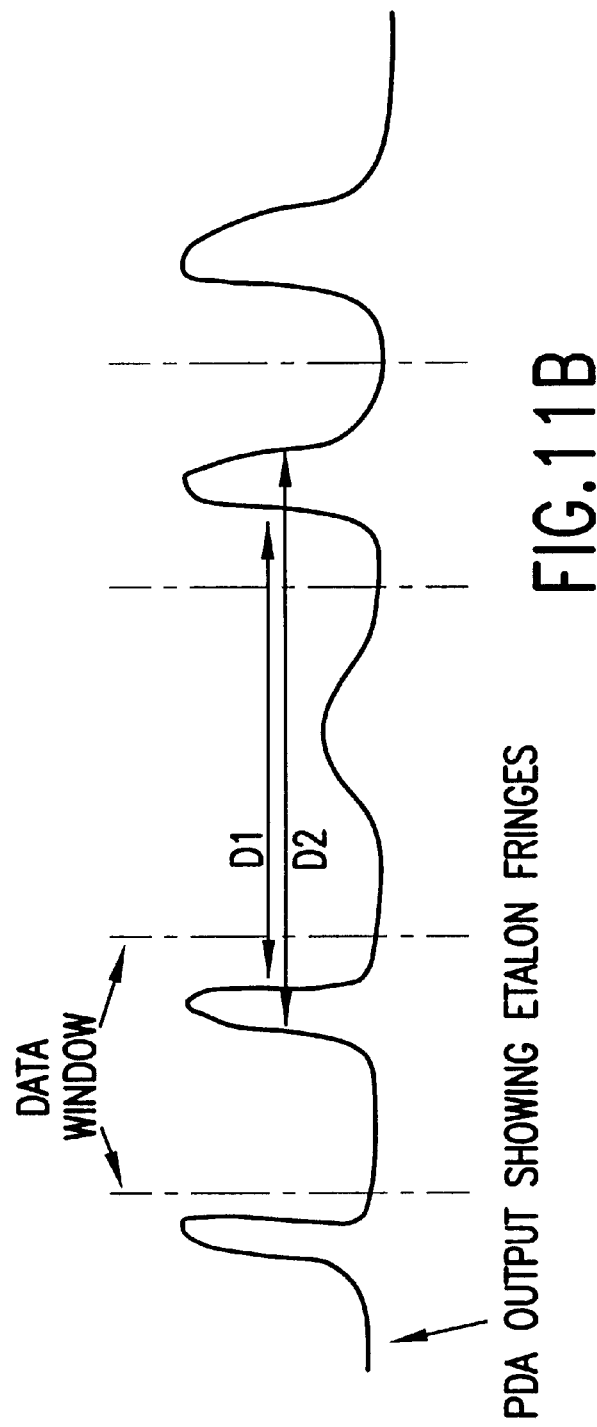
Figure 12A:
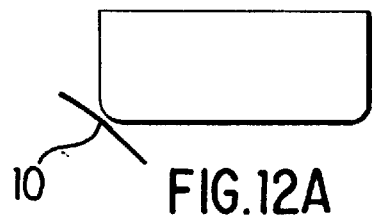
FIG. 12 shows various anode support bar designs.
Figure 12B:
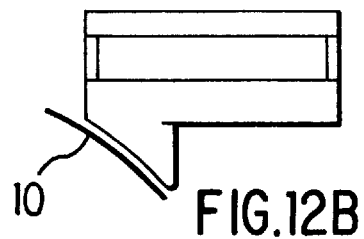
Figure 12C:
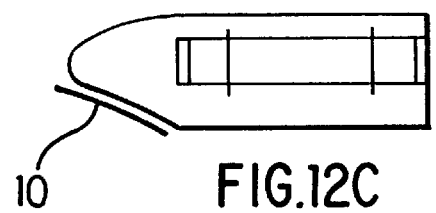
Figure 12D:
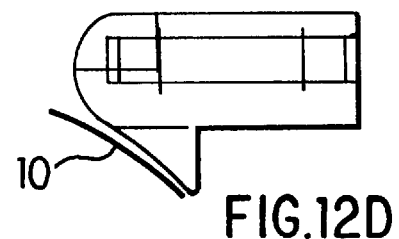
Figure 12E:
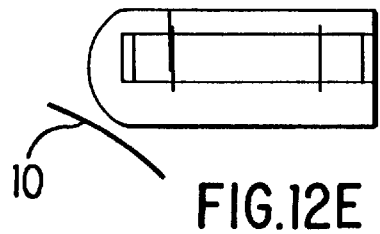

The specific details of the algorithm used in this preferred embodiment will now be described. FIG. 11B is a curve with 5 peaks is shown which represents a typical etalon fringe signal as measured by a linear photodiode array. The central peak is drawn lower in height than the others. As different wavelengths of light enter the talon, the central peak will rise and fall, sometimes going to zero. This aspect renders the central peak unsuitable for the present purpose. The other peaks will move toward or away from the central peak in response to changes in wavelength, so the position of these peaks determines the wavelength, while their width measures the bandwidth of the laser. A region labeled data window is shown in FIG. 11B. The data window is located so that the fringe nearest the central peak is normally used for the analysis. However, when the wavelength changes to move the fringe too close to the central peak (which will cause distortion and resulting errors), the second closest peak will be inside the data window, and the software will jump to that peak. Conversely, when the wavelength shifts to move the current peak outside the data window away from the central peak the software will jump to an inner fringe within the data window.

The steps involved are as follows:
 1. After a laser shot, the photo diode array is electronically read out and digitized. Data points are separated by an interval physically determined by the spacing of the photo diode array elements, typically 25 microns.
 2. The digital data is searched to find the peak intensity value in the data window. The previous peak location is used as a starting point. Small regions are searched left and right of the starting point. The search region is extended by small intervals left and right until a peak is found. If the peak is outside the data window, the search will automatically continue until the other peak is found.
 3. Based on the intensity of the peak, a 50% level is computed. This is shown at the top of the figure. The 0% level is measured periodically between the peaks. Based on the computed 50% level, points are examined right and left of the peak until the data points which border the 50% level are found. A linear interpolation is computed between pairs of points, which border the 50% level to find the left and right half-maximum positions, labeled A, and B in FIG. 11A. These positions are computed to a fraction of a pixel such as $\frac{1}{16}$, still using an integer data format.
 4. Steps 2 and 3 are duplicated for the two data windows, giving a total of four interpolated 50% positions. As indicated FIG. 11B, two diameters are computed. D1 is the inner fringe diameter while D2 is the outer fringe diameter.
 5. The D1 and D2 values (in pixel index units) are converted into wavelength by multiplying by an appropriate scale factor.
 6. The bandwidth of the laser is computed as (D2−D1)/2. A linear correction factor is applied to account for the intrinsic width of the etalon peak adding to the true laser bandwidth. Mathematically, a deconvolution algorithm is the formalism for removing the intrinsic width from the measured width, but this would be far too computationally intensive, so a linear approximation is applied which provides sufficient accuracy.
 7. The laser wavelength is computed as (D1+D2)/2 MOD 20, where MOD is the modulus operator and 20 is the free spectral range (FSR) of the etalon (spacing between peaks). The MOD operator is appropriate because the fringe pattern repeats every 20 pm, or whatever the FSR of the etalon in use.
 8. To compute the absolute wavelength, a coarse wavelength measurement is also performed which is required only to have +/−10 pm accuracy. For example, the coarse wavelength might be measured as 248.35 nm, while the etalon wavelength indication could be X.X5731, where X indicates digits that are indeterminate due to the modulus operation. Note that there is one digit that overlaps for both readings, a 5 in this case. Agreement of the overlapping digit for both coarse and etalon calculations is used to verify self-consistency.

About 10% of that portion of the beam that passes through mirror 182 are reflected from mirror 186 into fiber optic input 188 and the light travels through an optical fiber to atomic wavelength reference 190. The optical fiber connects to atomic reference unit 190 at opening 191, and the light from the optical fiber reflects off mirror 69 and is focused by lens 193 to a focal point in the center of neon iron vapor cell 194, and is focused again by lens 195 onto photodiode 196. Atomic wavelength reference unit 190 is used to calibrate wavemeter 120A. This is done by adjusting the wavelength of the laser while keeping the output energy constant as shown by detector 69 while monitoring the output of photodiode 196. When photodiode 196 shows a substantial reduction in output while photodiode 69 shows nominal output, the wavelength of the output must correspond to the iron vapor absorption line of 248.3271 nm. The position data corresponding to the etalon fringes and the position data corresponding to the image produced by grating 176 on linear photo diode 180 when the output of photo diode 196 is lowest is detected and recorded by wavemeter controller 197 and this data are used by the wavemeter controller 197 to calibrate wavemeter 120A.

LASER COMPONENT COOLING

Preferred embodiments of the present invention includes a unique cooling technique shown in FIG. 17 for cooling an excimer laser.

Components of the laser are contained in enclosure 240 which is maintained on the inside at a slight vacuum produced by a blower mounted in a vent as shown at 224 in FIGS. 17 and 4A. The cabinet comprises filtered intake port 241 near the top of the cabinet and a few small leakage sources, such as around gasketed doors, so that the flow of room air through the laser enclosure is about 200 ft$^3$/min which is not nearly sufficient to remove the heat produced by heat producing components of the laser.

The very great majority (roughly 90 percent) of the waste heat produced by the laser (roughly 12 kw at 100% duty factor) is removed by a chilled water system as shown in FIG. 17.

In this embodiment the major heat sources in the laser are the high voltage supply 20, the commutator 40, the compression head 60 and the laser chamber 80. For the chamber a water cooled heat exchanger is located inside the chamber and heat is transferred from circulating laser gas to the heat exchanger to the cooling water. Another heat exchanger (not shown) is mounted on an outside surface of the chamber. For the rest of the major heat producing components cooling water is piped to the location of the component and one or more fans force air through a water-to-air heat exchanger onto the component as shown in FIG. 17. For the compression head the circulation is contained as shown, but for the HVPS and the commutator the circulation is onto the component then through other portions of the enclosure to also cool other components before being recirculated back to the heat exchangers.

Dividing pans 242 and 243 guide the general ventilation air from filter 241 through a path shown by open headed arrows 244 to vent 224.

This cooling system contains no ducts and except for a water line feeding the heat exchangers inside of and attached to the laser chamber there is no water line connection to any laser component. Since all components (other than the laser chamber) are cooled by air blown about inside the enclosure, there are no cooling connections to make a break when installing and replacing components. Also, the lack of need for ducting greatly increases useable components and working space inside the enclosure.

PULSE ENERGY CONTROL ALGORITHM

Mode of Operation—Chip Lithography

The embodiment of the present invention includes a computer controller program with a new algorithm, which substantially reduces prior art variations in pulse energy and total integrated burst energy. The improved equipment and software and a preferred process for reducing energy sigma and burst dose variation is described below.

As stated in the background section of this specification, the burst mode is a typical mode of operation of an excimer laser used for the light source of a stepper machine in the lithographic production integrated circuits. In this mode the laser is operated to produce "a burst" of pulse at the rate of 2000 Hz for about 110 milliseconds to produce 220 pulses to illuminate a section of a wafer. After the burst the stepper moves the wafer and the mask and once the move is complete which takes typically a fraction of a second the laser produces another 220 pulse burst. Thus, normal operation is bursts of about 220 milliseconds followed by dead times of a fraction of a second. At various times, longer dead time periods will be provided so that other operations can be performed. This basic process continues 24 hours a day, 7 days per week, for several months with the laser typically producing several millions of bursts per day. In the above burst mode, it is usually important that each section of the wafer received the same illumination energy on each burst. Also, chip makers want the pulse to pulse variation to be minimized.

This preferred embodiment of the present invention accomplishes these objectives with equipment and software which monitors the energy of each pulse (pulse N−1) then controls the energy of the next pulse (pulse N) based on the results of a:

1) a comparison of the measured energy of pulse N−1 with a target pulse energy and
2) a comparison of the accumulated dose of the burst through pulse N−1 to a target pulse dose through pulse N−1.

In the typical KrF excimer laser we have been discussing the energy of the first 60–80 pulses is typically less stable than the rest of the burst due to transient effects in the laser gas. After about 40 ms following the first pulse, the pulse energy at constant voltage is relatively constant. In dealing with these early perturbations, Applicants have separated the burst into two time-wise regions, the first region (consisting of a number of the earlier pulses, for example, 80 pulses) called the "K" region and a second region (consisting of the pulses which follow the K region) which Applicants, in this specification, refer to as the "L" region.

This embodiment of the present invention utilizes prior art excimer laser equipment for pulse energy control. Pulse energy of each pulse of each burst is measured by photodiode 69 as shown in FIG. 10. The overall response time of this photodiode and its sample and hold circuit, including time required to reset the circuit, is less than substantially less than 500 microseconds. The accumulated signal resulting from each approximately 15 ns pulse is stored a few microseconds after the pulse is over and this signal is read six times and the average is stored by computer controller 22 approximately 1.0 microsecond after the beginning of the pulse. The accumulated energy of all the previous individual pulses in a burst is referred to as the burst dose value. Computer controller utilizes the signal representing the pulse energy of pulse N along with target pulse energy and the burst dose value in order to specify the high voltage for the pulse N+1. This calculation requires about 200 microseconds. When the value of high voltage for N+1 is determined, computer controller sends a signal to the high voltage command (VCMD) 120 of the high voltage power supply as shown in FIG. 9 establishing the charging voltage for pulse N+1 that takes a few microseconds. Computer controller 22 commands the high voltage power supply to charge up capacitor Co to the specified voltage. (At high repetition rates in excess of 2000 Hz it may be desirable to start the charging before the calculation is complete.) The charging requires about 250 microseconds so that Co is fully charged and ready to go when it receives a trigger signal for pulse N+1 from trigger circuit 13 as shown in FIG. 2 at 0.5 millisecond after the trigger signal from pulse N. On the trigger signal, capacitor $C_o$ discharges its approximately 700 volts into the magnetic compression circuit shown in FIG. 4 over a period of about 5 microseconds and the pulse is compressed and amplified by the magnetic compression circuit to produce a discharge voltage on capacitor Cp of about 16,100 volts which discharges across electrodes 6 in about 100 ns producing a laser pulse of about 10 mJ and about 15 ns in duration.

Preferred Algorithm

A special preferred process for adjusting the charging voltage to achieve substantially desired pulse energies when operating in a burst mode is described below.

The process utilizes two voltage adjustment algorithms. The first algorithm applies to the first 80 pulses and is called the KPI algorithm. The second algorithm called the PI algorithm applies to pulses after pulse number 80. This time period after the 80$^{th}$ pulse is herein called the "L region" of the burst. The initials "PI" refer to "proportional integral" and the "K" in "KPI" refers to the "K region" of the burst.

KPI Algorithm

The K region comprises pulses 1 through k, where k=80 for this preferred embodiment. The algorithm for setting the charging voltage for pulse N is:

$$V_N = (V_B)_N - (V_C)_{N-1} \quad N=1,2,\ldots k$$

where:

---

$V_N$ = charging voltage for N'th pulse $(V_B)_N$ = an array of k stored voltages which represent the current best estimate of the voltage required to produce the target energy $E_T$ for the N'th pulse in the K region. This array is updated after each burst according to the equation below.

$(V_C)_{N-1}$ = a voltage correction based the energy error of the previous pulse and on the energy errors which occurred for the previous pulses in the burst, up to pulse N − 1

$$= \sum_{i=1}^{N-1} \frac{(A \cdot \epsilon_i + B \cdot D_i)}{(dE \mid dV)}$$

---

By definition, $(V_c)_0 = 0$

---

A, B = fractions typically between 0 and 1, which in this preferred embodiment both A and B are 0.5

$\epsilon_i$ = the energy error of the i'th pulse
 = $E_i - E_T$, where $E_i$ is the energy for the i'th pulse, and $E_T$ is the target energy $D_i$ = the cumulative dose error of the burst, including all pulses from 1 through i $$= \sum_{k=1}^{i} \epsilon_k$$

dE/dV = a rate of change of pulse energy with charging voltage. (In this embodiment, one or more values of dE/dV is determined experimentally during each burst and a running average of these values is used for the calculation)

---

The stored values (VB)N are updated during or after each burst according to the following relation:

$$(V_B)_N^{M+1} = (V_B)_N^M - C \cdot \left( \frac{\epsilon_N}{dE \mid dV} - (V_C)_N \right),$$

where the index M refers to the burst number

C = a fraction typically between 0 and 1, which in this preferred embodiment is 0.3.

PI Algorithm

The L region comprises pulses k+1 to the end of the burst (for a preferred embodiment, pulse numbers 81 and higher). The algorithm for setting the charging voltage for pulse N is:

$$V_N = V_{N-1} - \frac{(A \cdot \epsilon_{N-1} + B \cdot D_{N-1})}{(dE \mid dV)} \quad N = k+1, k+2, \ldots$$

where:

$V_N$ = charging voltage for N'th pulse $V_{N-1}$ = charging voltage for N−1'st (previous) pulse The variables A, B, $\epsilon_1$, $D_1$, and dE/dV are defined as before.

Determination of dE/Dv

A new value for dE/dV is determined periodically, in order to track the relatively slow changes in the characteristics of the laser. In the preferred embodiment, dE/dV is measured by varying or dithering the voltage in a controlled manner during two successive pulses in the L region. For these two pulses, the normal PI energy control algorithm is temporarily suspended and replaced by the following:

For pulse j:

$$V_j = V_{j-1} - \frac{(A \cdot \epsilon_{j-1} + B \cdot D_{j-1})}{(dE \mid dV)} + V_{Dither}$$

where $V_{Dither}$ = a fixed voltage increment, typically a few volts For pulse j+1:

$$V_{j+1} = V_j - 2 \cdot V_{Dither}$$

After pulse j+1, dE/dV is calculated:

$$dE \mid dV = \frac{(E_{j+1} - E_j)}{-2 \cdot V_{Dither}}$$

The calculation of dE/dV can be very noisy, since the expected energy changes due to the dithering voltage can be of the same magnitude as the normal energy variation of the laser. In the preferred embodiment, a running average of the last 50 dE/dV calculations is actually used in the PI and KPI algorithms.

The preferred method for $V_{Dither}$ choosing is to specify a desired energy dither $E_{Dither}$, typically a few percent of the energy target $E_T$, and then use the current (averaged) value for dE/dV to calculate $V_{Dither}$:

$$V_{Dither} = \frac{E_{Dither}}{(dE \mid dV)}$$

Pulse j+2 (immediately following the two dithered pulses) is not dithered, but has the special value:

$$V_{j-2} = V_{j-1} + V_{Dither} - \frac{(A \cdot (\epsilon_{j+1} + E_{Dither}) + B \cdot D_{j+1})}{(dE \mid dV)} \quad (\text{pulse } j+2)$$

This special value for $V_{j+2}$ is corrected for both the applied voltage dither and the expected energy dither from pulse j+1.

Many variations on the algorithm described above are possible. For example, dE/dV can be determined in the L region as well as the K. The dithering can be performed once per burst, or several times. The dithering sequence may be performed at a fixed pulse number j as described above, or it may be initiated for a randomly chosen pulse number which varies from one burst to the next.

The reader should recognize that A, B and C are convergence factors, which could have many other values. Higher values than those specified above could provide quicker convergence but could lead to increased instability. In another preferred embodiment, $$A = \sqrt{2B}.$$

This relationship is developed from a recognized technique to produce critical damping. B could be zero in which case there would be no dose correction; however, A should not be zero because it provides a dampening term for the dose conveyance portions of the algorithm.

If the determined value of dE/dV becomes too small the above algorithm could cause over correction. Therefore a preferred technique is to arbitrarily double dE/dV if the energy sigma value exceeds a threshold. Default values of V and dE/dV are provided for the first pulse of a burst. D is set to zero at the start of each burst. The default dE/dV is set at about three times the expected dE/dV to avoid initial over correction.

An alternate method of determining dE/dV without the dither referred to above is to merely measure and store the energy and voltage values during laser operation. (Measured rather than specified voltage values can also be used.) These data can be used to determine dE/dV as a function of V for constant pulse energy. The reader should note that each individual value of dE/dV would contain fairly large uncertainties because the elements of the value are differences of measurements having significant uncertainties. However, averaging large numbers of dE/dV values can reduce these uncertainties. The dither exercise to determine dE/dV does not have to be made on each burst but instead could be done periodically such as once every M bursts. Or the measurement of dE/dV could be replaced by a calculation performed by the computer or the value of dE/dV could be inserted manually by the operator of the previous pulse for the calculation of $V_{N-1}$. An alternate approach would be to use the actual measured value for $V_N$ for this control system. Also the value of $V_{BIN}$ are calculated from specified values, not actual measure values in the above-described embodiment. An obvious alternative would be to use measured voltage values. $E_T$ is normally a constant value such as 10 mJ but it does not have to be constant. For example, $E_T$ of the last ten pulses could be smaller than the nominal pulse energy so that percentage deviations from target $E_T$ for these pulses would have a smaller effect on the integrated pulse dose. Also, it may be preferable in some situations to program computer controller 22 to provide $E_T$ values that vary from burst to burst.

Although this very narrow-band KrF excimer laser has been described with reference to a particular embodiment, it is to be appreciated that various adaptations and modifications may be made. For example, many alternative embodiments are discussed in the patent applications listed in the first sentence of this specification, all of which have been incorporated herein by reference. The invention is to be limited only by the appended claims.

What is claimed is:

1. An electric discharge laser for producing a narrow band pulsed laser beam at repetition rates of at least about 2000 Hz, said laser comprising:
   A. a laser chamber comprising:
      1) two elongated electrodes;
      2) a laser gas comprising
         a) a noble gas,
         b) fluorine, and
         c) a buffer gas;
      3) a gas circulator for circulating said gas between said electrodes at speeds of at least two cm/millisecond
   B. a pulse power system comprising a power supply and pulse compression and amplification circuits and pulse power controls for producing high voltage electrical pulses of at least 14,000 volts across said electrodes at rates of at least about 2000 Hz,
   C. a line narrowing system for controlling wavelengths of said laser beams to less than about 0.6 pm, FWHM; and
   D. a laser pulse energy control system for controlling the voltage provided by said pulse power system, said control system comprising a laser pulse energy monitor and a computer processor programmed with an algorithm for calculating, based on historical pulse energy data, electrical pulses needed to produce laser pulses having pulse energies within a desired range of energies.

2. A laser as in claim 1 wherein said chamber, said pulse power system, said line narrowing system, said energy control system and substantially all electrical, optical and mechanical components of said laser are contained in quickly replaceable modules.

3. A laser as in claim 1 wherein said chamber and said gas circulator define a gas flow path and an upstream direction and said laser also comprises a single preionizer tube located upstream of said electrodes.

4. A laser as in claim 3, wherein each of said electrodes define an electrode length and said single preionizer tube comprises a grounded electrically conducting rod positioned along the axis of an $Al_2O_3$ hollow cylindrical tube having a length longer than said electrode length.

5. A laser as in claim 1, wherein said line narrowing system comprises a tuning mirror, a grating tuned to a nominal wavelength, and at least three beam expanding prisms, at least one of which prisms comprises calcium fluoride.

6. A laser as in claim 5, wherein all of said at least three prisms comprise calcium fluoride.

7. A laser as in claim 1 wherein said laser gas contains oxygen at a concentration of between 1 part per million and 10 parts per million.

8. A laser as in claim 1 wherein said two elongated electrodes define a cathode and an anode, said anode being supported by an anode support bar comprising cooling fins.

9. A laser as in claim 1 wherein said two elongated electrodes define a cathode and an anode and said anode comprises cooling fins.

10. A laser as in claim 8 wherein said anode and said anode support bar together have a combined mass of at least about 3.4 kg.

11. A laser as in claim 1 wherein said pulse power system comprises at least three modules each of which is designed for quick removal and replacement.

12. A laser as in claim 1 wherein said laser chamber defines a chamber structure and wherein said two elongated electrodes define a cathode and an anode and said cathode is insulated from said chamber structure by a single piece insulator comprising $Al_2O_3$, which is attached to a portion of said chamber structure.

13. A laser as in claim 12 wherein the portion of said chamber structure to which said single piece insulator is attached comprises a material having a coefficient of thermal expansion similar to that of $Al_2O_3$.

14. A laser as in claim 13 wherein said structure material is ASTM A36 steel.

15. A laser as in claim 12 wherein said cathode is mounted directly on said single piece insulator.

16. A laser as in claim 1 wherein said laser chamber includes a plurality of seals and all seals exposed to said laser gas are metal seals.

17. A laser as in claim 1 further comprising flow vane structures comprising monel.

18. A laser as in claim 1 and further comprising acoustic baffles.

19. A laser as in claim 2 wherein said gas circulator comprises a plurality of bearings and wherein said two elongated electrodes define a cathode and an anode and said anode is supported by an anode support bar having a tapered surface positioned to reduce aerodynamic reaction forces on said bearings.

20. A laser as in claim 1 wherein said power supply comprises a rectifier for converting AC power to DC power, an inverter for converting the DC power to high frequency AC power, a step-up transformer for increasing the voltage of said high frequency AC power to a higher voltage, a rectifier for converting the higher voltage to charge a charging capacitor to a voltage at or approximately at a command voltage established by said laser pulse energy control system.

21. A laser as in claim 20 wherein said power supply is configured to slightly over charge said charging capacitor and further comprises a bleed circuit to bleed down said charging capacitor to said command voltage.

22. A laser as in claim 21 wherein said pulse power system comprises a solid state switch which upon closing initiates said high voltage electrical pulses by allowing charge to flow from said charging capacitor to a second capacitor to create a high voltage charge on said second capacitor.

23. A laser as in claim 12 and further comprising an inductor, a pulse transformer having a primary side and an output terminal, and a third capacitor wherein said inductor, pulse transformer and said third capacitor are arranged to permit the high voltage charge on said second capacitor to flow to ground through the primary side of said pulse transformer in order to produce an electrical pulse having a voltage higher than that of said high voltage charge at the output terminal of said pulse transformer to be stored temporarily on said third capacitor.

24. A laser as in claim 23 wherein said primary side of said pulse transformer comprises a plurality of hollow spools, each spool defining an axis, connected in series, and a secondary side of said pulse transformer comprises at least one rod co-aligned with an axis of said plurality of hollow spools.

25. A laser as in claim 24 wherein said at least one rod is four rods connected in series and defining two leads, respectively a ground lead and a very high voltage lead.

26. A laser as in claim 1 wherein said laser pulse power system comprises at least one saturable inductor with a coil immersed in oil contained in a pot which also serves as the high voltage lead of the inductor.

27. A laser as in claim 1 and further comprising an electric power distribution module comprising a plurality of multi-pin electrical connectors mounted on a frame and at least one easily replaceable breaker-relay DIN rail having mounted thereon a plurality of breakers and/or relays and also having mounted thereon with respect to each breaker and/or relay a multi-pin connector for quick electrical connection with a mating multi-pin connector on said frame.

28. A laser as in claim 27 wherein said at least one breaker-relay DIN rail is a plurality of breaker-relay DIN rails and said frame is in the form of stair steps.

29. A laser as in claim 1 wherein said gas circulator comprises a blower comprising a shaft supported by at least two magnetic bearings, each bearing comprising a stator and a rotor; said shaft bearing driven by a motor comprising a stator and a rotor, said blower also comprising a sealing means for sealing said rotors within an environment containing said laser gas with said stators outside said laser gas environment.

30. A laser as in claim 1 and further comprising an $N_2$ purge system providing an $N_2$ purge flow to all laser optical components outside the laser chamber wherein said purge flow is contained at a pressure of less than 10 pascals, and wherein an outlet of said purge flow from each of said optical components is connected to a flow rate sensing device for monitoring of the operation of said $N_2$ purge system.

31. A laser as in claim 1 and further comprising a line narrowing etalon output coupler.

32. A laser as in claim 5 and further comprising a line narrowing etalon output coupler.

33. A laser as in claim 32 wherein said etalon output coupler is configured and aligned to operate in a reflective mode and is tuned to substantially the same nominal wavelength as said grating.

34. A laser as in claim 1 and further comprising a wavemeter configured to measure wavelengths of laser pulses at rates of at least 2 kHz.

35. A laser as in claim 1 and further comprising a wavemeter, said wavemeter comprising a grating-based wavelength monitor providing a coarse measurement of wavelength being aligned to focus an optical indication of relative wavelength at a first location on a diode array and an etalon-based wavelength monitor being aligned to focus an optical indication of relative wavelength at a location on said diode array different from said first location.

36. A laser as in claim 35 and further comprising an atomic reference unit for calibrating said grating-based wavelength monitor and said etalon-based wavelength monitor.

37. A laser as in claim 1 and further comprising a blower and an anode support means comprising a tapered surface for reducing the magnitude of aerodynamic reaction forces resulting from laser gas exiting said blower and being redirected by said anode support means.

38. A laser as in claim 1 and further comprising a fluorine injection system comprising a processor programmed with an algorithm designed to cause fluorine to be injected continuously or at intervals of less than 30 minutes in order to maintain fluorine concentration substantially constant at a desired concentration over extended time periods of at least more than one day.

39. A laser as in claim 38 further comprising a feedback circuit providing to said processor a voltage signal representative of laser discharge voltages, which signal is used by said processor to maintain said signal within a predetermined range.

40. A laser as in claim 39 wherein said predetermined range is revised periodically in order to keep the laser operating with a fluorine concentration within a desired range.

41. A laser as in claim 38 further comprising a means for periodically determining a laser parameter representative of a temporal pulse width of the laser pulses.

42. A laser as in claim 41 wherein said determined parameter represents the full width half maximum temporal pulse width.

43. A laser as in claim 41 wherein said determined parameter is an integral square pulse width.

44. A laser as in claim 1 and further comprising a component cooling system said system comprising:
A. an enclosure housing a plurality of laser components, said components defining at least four major waste heat sources,
B. a vent containing a blower to maintain said components in a slight vacuum,
C. a chilled water cooling system comprising a system of water pipes providing chilled water flow to a heat exchanger located inside said laser chamber and at least three other water/air heat exchangers, positioned near said waste heat sources within said enclosure,
D. at least one blower positioned near each of said at least three other heat exchangers and oriented to force air cooled by said heat exchanger onto said heat source.

45. A laser as in claim 44 wherein said heat sources comprise respectively components of a high voltage power supply, components of a commutator, and components of a voltage compression circuit.

46. An electric discharge laser for producing a narrow band pulsed laser beam at a repetition rate of at least about 2 Khz, said laser comprising:
A. a quickly replaceable laser chamber module comprising:
1) two elongated electrodes
2) a laser gas comprising a noble gas, fluorine and a buffer gas,
3) a gas circulator system for circulating said laser gas between said electrodes at at least two cm/millisecond comprising:
a) a braze-free blade structure defining a shaft,
b) a brushless motor for rotating said shaft,
c) magnetic bearings for supporting said shaft; said motor and said bearings having rotors attached to said shaft and sealed within an environment exposed to said laser gas, and said motor and said bearings having stators outside of said laser gas environment,
B. a pulse power system substantially contained within at least one quickly replaceable module and comprising:
1) a processor controlled high voltage power supply for periodically, at rates of at least about 2000 Hz, charging with electrical energy a charging capacitor to a predetermined pulse control voltage,
2) a compression and amplification circuit for connecting electrical energy stored on said charging capacitor into a high voltage electrical pulse of at least 14,000 volts across said electrodes, and
C. a quickly replaceable line narrowing module for controlling wavelength of said laser beam to less than about 0.6 pm, FWHM.

47. A laser as in claim 46 wherein said chamber and said gas circulator define a gas flow path and an upstream direction and said laser also comprises a single preionizer tube located upstream of said electrodes, and wherein each of said electrodes defines an electrode length, and said single preionizer tube comprises a grounded electrically conducting rod positioned along the axis of an $Al_2O_3$ hollow cylindrical tube having a length longer than said electrode length.

48. A laser as in claim 46 wherein said line narrowing module comprises a tuning mirror, a grating, and at least three beam expanding prisms, all of said prisms comprising calcium fluoride.

49. A laser as in claim 1, wherein said electric discharge laser is selected from the group consisting of ArF and KrF excimer lasers and fluorine ($F_2$) molecular lasers.

50. A laser as in claim 46, wherein said electric discharge laser is selected from the group consisting of ArF and KrF excimer lasers and fluorine ($F_2$) molecular lasers.

51. A laser as in claim 1 and further comprising a processing means programmed with an algorithm for controlling pulse energy and integrated energy dose in bursts of pulses produced by the laser, said algorithm comprising steps in which:
A) the laser output energy of each pulse in a burst of pulses defining a present burst of pulses is measured,
B) the rate of change of pulse energy with charging voltage is determined,
C) a pulse energy error is determined with respect to a pulse occurring prior to a next pulse in the present burst of pulses,
D) an integrated dose error is determined for all previous pulses in the present burst of pulses, and
E) a charging voltage for a next pulse needed to produce in said next pulse a pulse energy converging on a target pulse energy is determined using the pulse energy error, the integrated dose error, the rate of change of energy with charging voltage, and a reference voltage.

52. A laser as in claim 51 wherein the reference voltage for said next pulse is a voltage calculated using prior pulse energy and charging voltage data.

53. A laser as in claim 52 wherein:
for a next pulse in a first set of consecutive pulses in said present burst, a specified voltage calculated using charging voltage and pulse energy data for a pulse in a previous burst of pulses corresponding to said next pulse is utilized as the reference voltage, and
for a next pulse in a second set of consecutive pulses in said present burst, the reference voltage is a voltage specified for a pulse immediately preceding the next pulse in said second set of pulses in said present burst.

54. A laser as in claim 51 wherein charging voltage $V_N$ for consecutive pulses $P_1, P_2 \ldots P_k$ is determined as follows:

$$V_N = (V_B)_N - (V_C)_{N-1} \quad N=1,2,\ldots k$$

where:

$V_N$ = charging voltage for N'th pulse,
$(V_B)_N$ = an array of k stored charging voltages which represents the current best estimate of the charging voltage required to produce the target pulse energy $E_T$ for the N'th pulse in the K region;
$(V_C)_{N-1}$ = a voltage correction based on the energy errors which occurred for the previous pulses in the burst, up to pulse N − 1

$$= \sum_{i=1}^{N-1} \frac{(A \cdot \epsilon_i + B \cdot D_i)}{(dE/dV)}$$

where by definition, $(V_C)_0=0$,

A, B = fractions typically between 0 and 1, preferably about 0.5,
$\epsilon_i$ = the energy error of the i'th pulse
= $E_i - E_T$, wherein $E_i$ is the pulse energy for the i'th pulse, and $E_T$ is the target pulse energy
$D_i$ = the cumulative dose error of the burst, including all pulses from 1 through i
= $\sum_{k=1}^{i} \epsilon_k$, and dE/dV = a rate of change of pulse energy with charging voltage, wherein the stored values $(V_B)_N$ are updated during or after each burst according to the following relation:

$$(V_B)_N^{M+1} = (V_B)_N^M - C \cdot \left( \frac{\epsilon_N}{dE/dV} - (V_C)_N \right),$$

where the index M refers to the burst number and
C = a fraction typically between 0 and 1, preferably about 0.3.

55. A laser as in claim 54 wherein charging voltage $V_n$ for pulses $P_{K+1}$ to $P_f$, wherein $P_f$ is the final pulse in the burst, is determined as follows:

$$V_N = V_{N-1} - \frac{(A \cdot \epsilon_{N-1} + B \cdot D_{N-1})}{(dE/dV)} \quad N = k+1, k+2, \ldots$$

where:

$V_N$ = charging voltage for the N'th pulse
$V_{N-1}$ = charging voltage for N−1'st (previous) pulse.

56. The laser as in claim 55 wherein dE/dV is determined by dithering the voltage in a controlled manner for two successive pulses, j and j+1 where:

$$V_j = V_{j-1} - \frac{(A \cdot \epsilon_{j-1} + B \cdot D_{j-1})}{(dE/dV)} + V_{Dither},$$

where $V_{Dither}$ = a fixed voltage and $$V_{j+1} = V_j - 2 \cdot V_{Dither},$$

and after pulse j+1, dE/dV is calculated according to:

$$dE/dV = \frac{(E_{j+1} - E_j)}{2 \cdot V_{Dither}}.$$

* * * * *

UNITED STATES PATENT AND TRADEMARK OFFICE
CERTIFICATE OF CORRECTION

PATENT NO. : 6,128,323
DATED : October 3, 2000
INVENTOR(S) : David W. Myers, et al.

Figure 13:
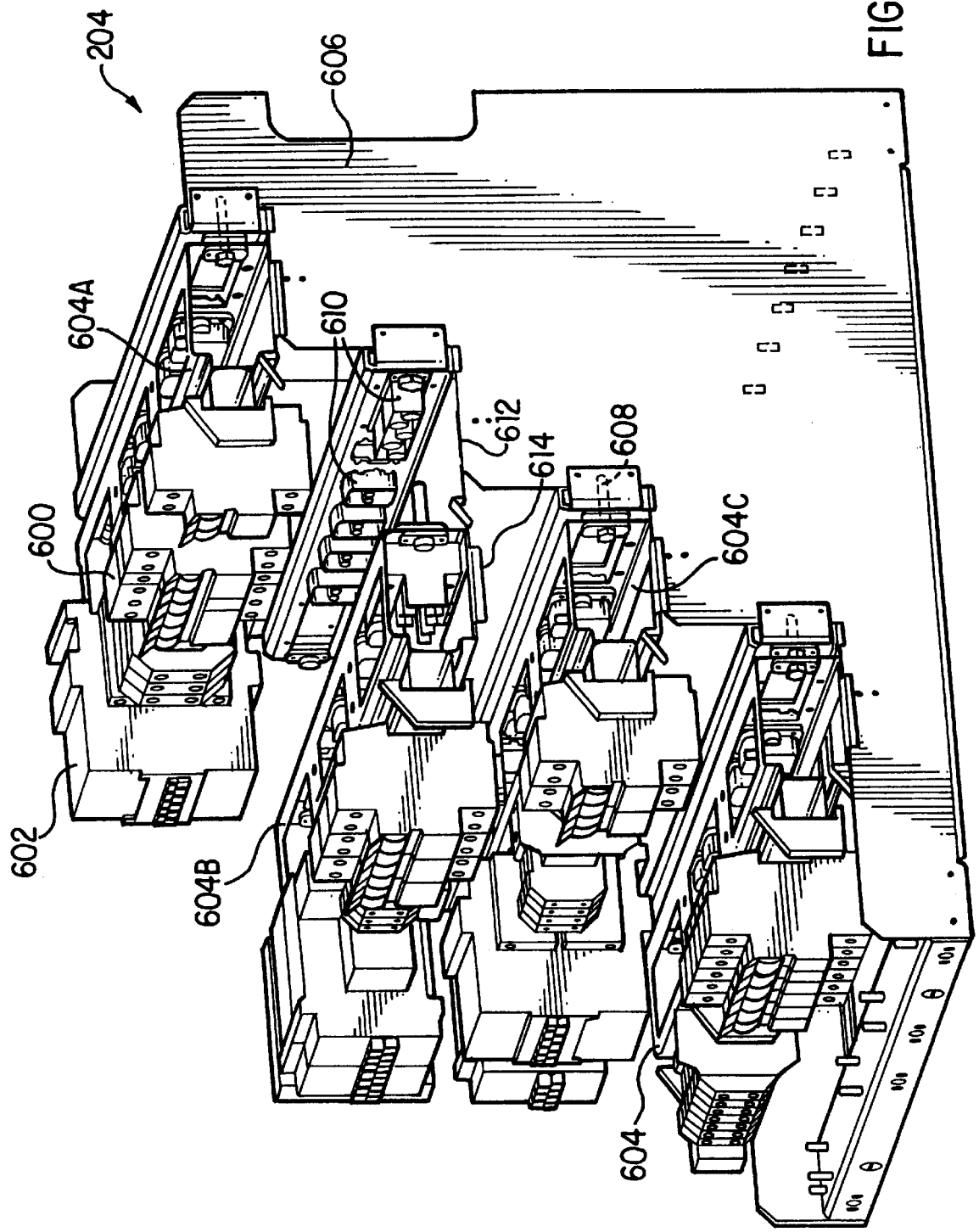
FIG. 13 shows a stairstep electrical distribution structure.

It is certified that error appears in the above-identified patent and that said Letters Patent is hereby corrected as shown below:

Column 4, line 21 delete "prospective" and insert --perspective--.
Column 5, line 63 delete "7/37" and insert --7/32--.
Column 7, line 19 delete "inconel 1718" and insert --Inconel 1718--.
Column 11, line 53 delete "eschelle" and insert --echelle--.
Column 15, line 6 delete "location 306. Where" and insert --location 306 where--.
Column 15, line 36 delete "transformers" and insert --transformer--.
Column 15, line 50 delete "prospective" and insert --perspective--.
Column 16, line 30 delete "FIG. 14" and insert --FIG 13--.
Column 20, line 23 delete "and for this type" and insert --and age for this type--.
Column 25, line 40 delete "(or use of" and insert --(no use of--.
Column 27, line 50 delete "make a break" and insert --make or break--.
Column 27, line 52 delete "increases useable components" and insert --increases access to components--.
Column 27, line 67 delete "production integrated circuits" and insert --"production of integrated circuits--.
Column 28, line 1 delete ""a burst" of pulse" and insert --a "burst" of pulses--.
Column 28, line 42 delete "less than substantially less than" and insert --substantially less than--.

Signed and Sealed this

Eighth Day of May, 2001

*Attest:*

NICHOLAS P. GODICI

*Attesting Officer*         Acting Director of the United States Patent and Trademark Office